(12) United States Patent
Masuoka et al.

(10) Patent No.: US 10,825,822 B2
(45) Date of Patent: Nov. 3, 2020

(54) PILLAR-SHAPED SEMICONDUCTOR DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP); Hiroki Nakamura, Tokyo (JP); Min Soo Kim, Leuven (BE); Zheng Tao, Leuven (BE)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 15 days.

(21) Appl. No.: 16/225,804

(22) Filed: Dec. 19, 2018

(65) Prior Publication Data

US 2019/0148387 A1 May 16, 2019

Related U.S. Application Data

(63) Continuation of application No. PCT/JP2017/039538, filed on Nov. 1, 2017.

(51) Int. Cl.
*H01L 29/66* (2006.01)
*H01L 27/11* (2006.01)
(Continued)

(52) U.S. Cl.
CPC .... *H01L 27/1104* (2013.01); *H01L 21/76802* (2013.01); *H01L 21/76804* (2013.01);
(Continued)

(58) Field of Classification Search
CPC .......... H01L 27/1104; H01L 29/66666; H01L 29/41741; H01L 23/5226; H01L 21/76802;
(Continued)

(56) References Cited

U.S. PATENT DOCUMENTS 8,373,235 B2 * 2/2013 Masuoka ............ H01L 27/0886
257/368
8,592,283 B2 * 11/2013 Ito ..................... H01L 21/02126
438/408

FOREIGN PATENT DOCUMENTS

WO WO 2009/096465 A1 8/2009
WO WO 2012/077178 A1 6/2012
(Continued)

OTHER PUBLICATIONS

International Preliminary Report on Patentability for Application No. PCT/JP2017/039538, dated Dec. 5, 2017, pp. 1-7.
(Continued)

*Primary Examiner* — Vu A Vu
(74) *Attorney, Agent, or Firm* — Brinks Gilson & Lione

(57) ABSTRACT

In an SRAM cell circuit, an N+ layer 12a and a P+ layer 13a, which are present between first gate connection W layers 22a and 22b connecting to gate TiN layers 23a and 23b in plan view, which connect to the bottom portions of Si pillars 11a and 11b, and which extend in the horizontal direction, connect through a second gate connection W layer 29a to a first gate connection W layer 22c, which connects to the gate TiN layers 23a and 23b and extend in the horizontal direction. The second gate connection W layer 29a has a bottom portion within the first gate connection W layer 22c, and has an upper surface positioned lower than the upper surfaces of the gate TiN layers 23a to 23f and the first gate connection W layers 22a to 22d.

20 Claims, 27 Drawing Sheets

(51) Int. Cl.
*H01L 23/522* (2006.01)
*H01L 21/768* (2006.01)
*H01L 23/528* (2006.01)
*H01L 29/417* (2006.01)

(52) U.S. Cl.
CPC .. *H01L 21/76805* (2013.01); *H01L 21/76843* (2013.01); *H01L 23/5226* (2013.01); *H01L 23/5286* (2013.01); *H01L 29/41741* (2013.01); *H01L 29/66666* (2013.01)

(58) Field of Classification Search
CPC ........... H01L 23/5286; H01L 21/76843; H01L 21/76804; H01L 21/76805; H01L 21/823885; H01L 21/823871; H01L 21/7682; H01L 21/76831; H01L 21/76879; H01L 21/76895; H01L 29/7827
USPC ....................................................... 257/329
See application file for complete search history.

(56) References Cited

FOREIGN PATENT DOCUMENTS

WO  WO 2013/171873 A1  11/2013
WO  WO 2015/022744 A1  2/2015

OTHER PUBLICATIONS

Takato et al., "Impact of Surrounding Gate Transistor (SGT) for Ultra-High-Density LSI's": IEEE Transaction on Electron Devices, vol. 38, No. 3, pp. 573-578 (1991).

Itoh et al. "Creep-up Phenomena in Tungsten Selective CVD and Their Application to VLSI Technologies", IEEE IEDM85, pp. 606-609 (1985).

* cited by examiner

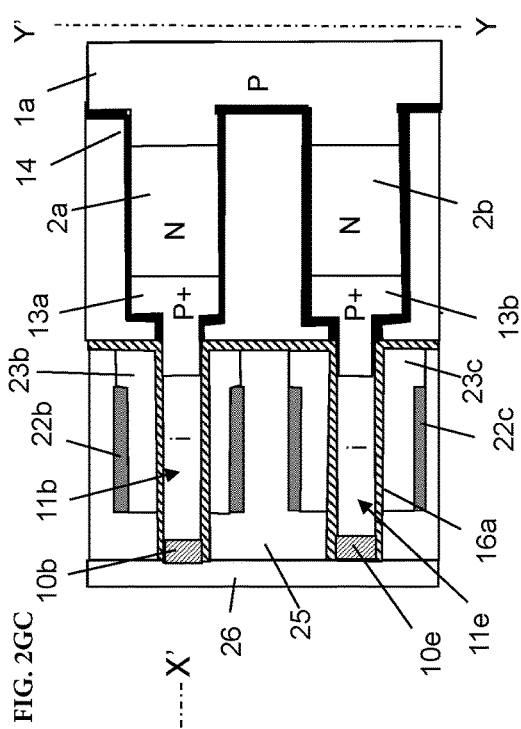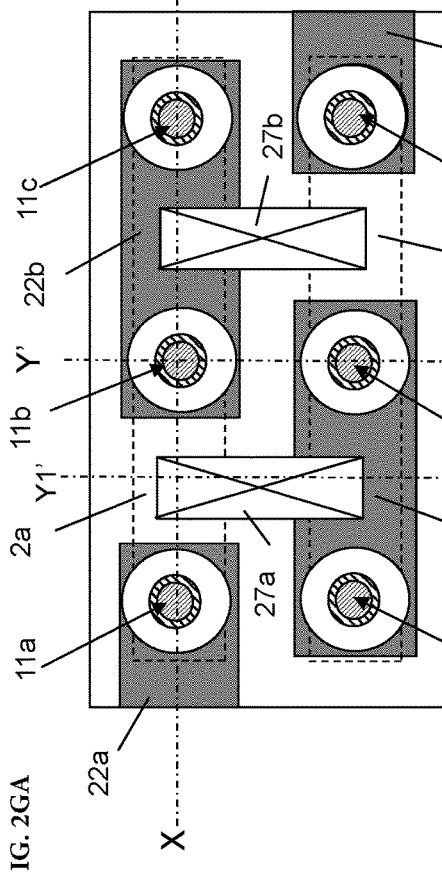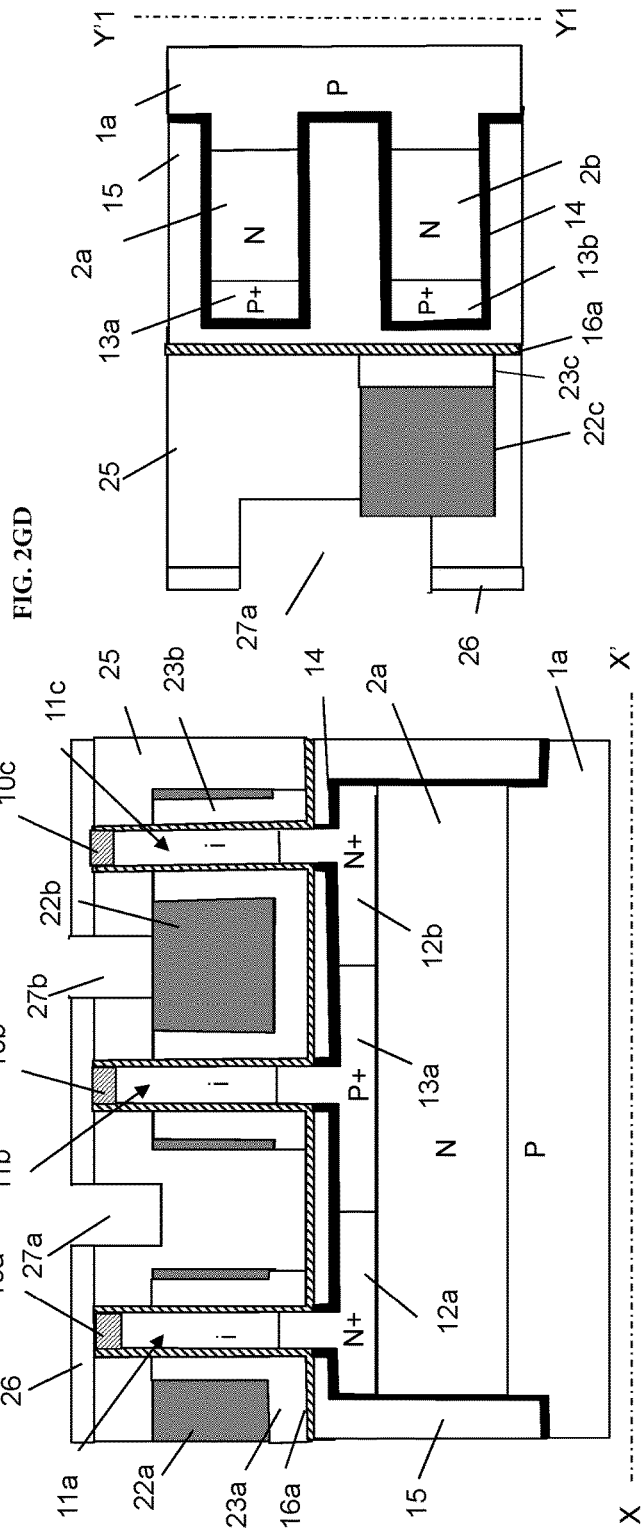
FIG. 2GA
FIG. 2GB
FIG. 2GC
FIG. 2GD

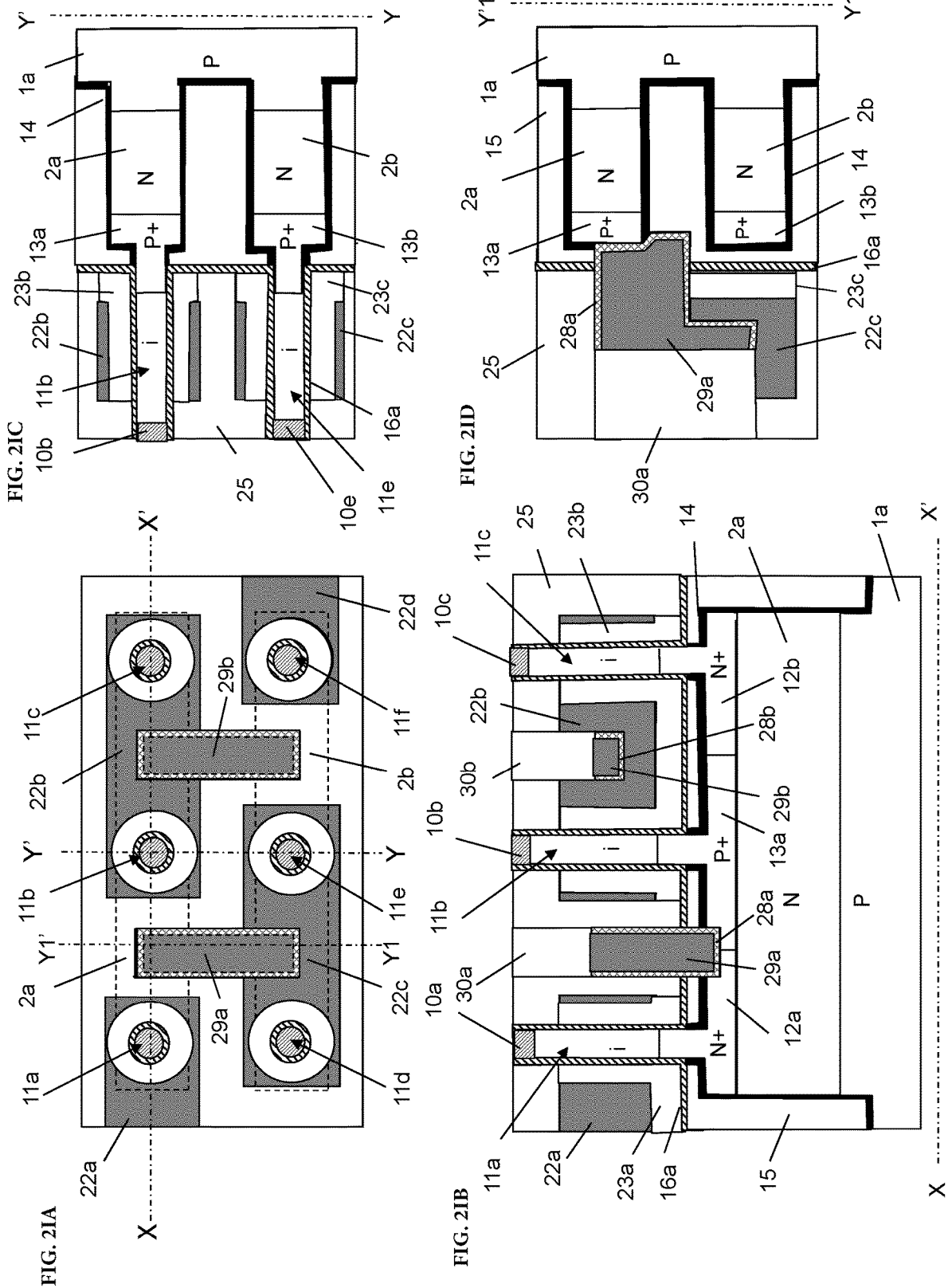

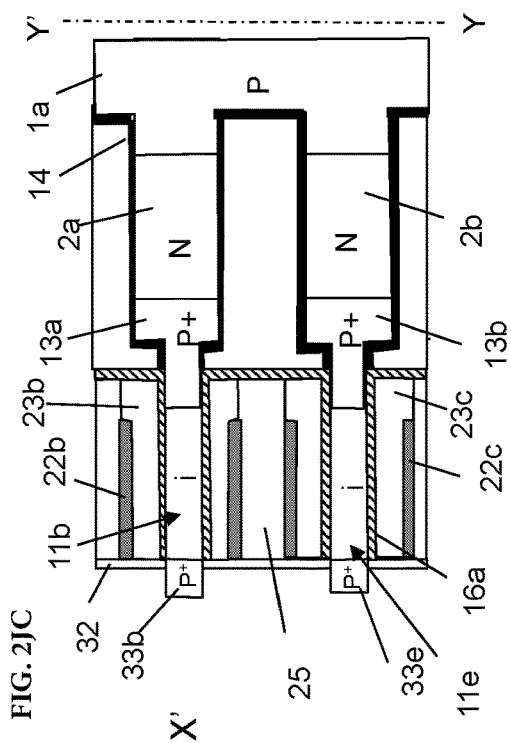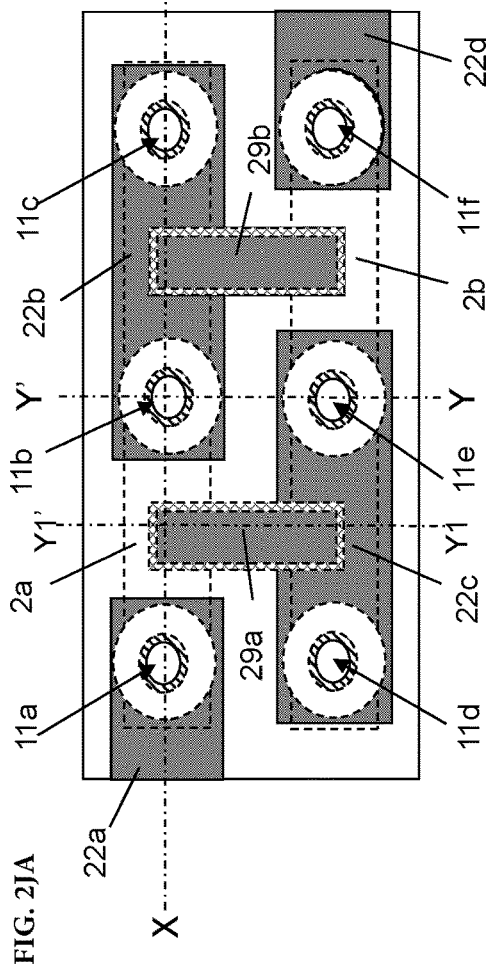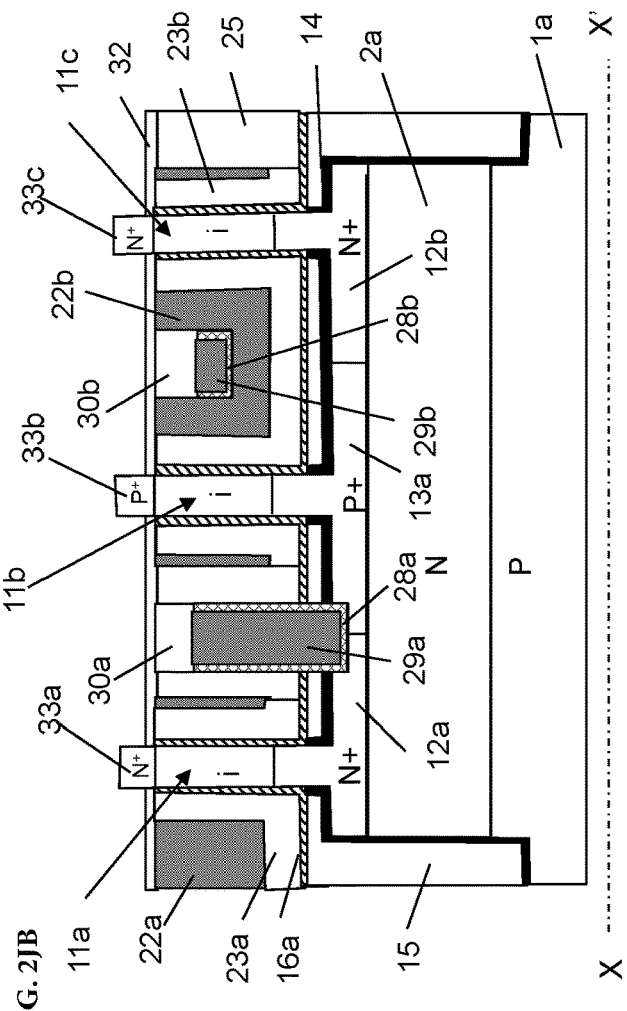
FIG. 2JA
FIG. 2JB
FIG. 2JC
FIG. 2JD

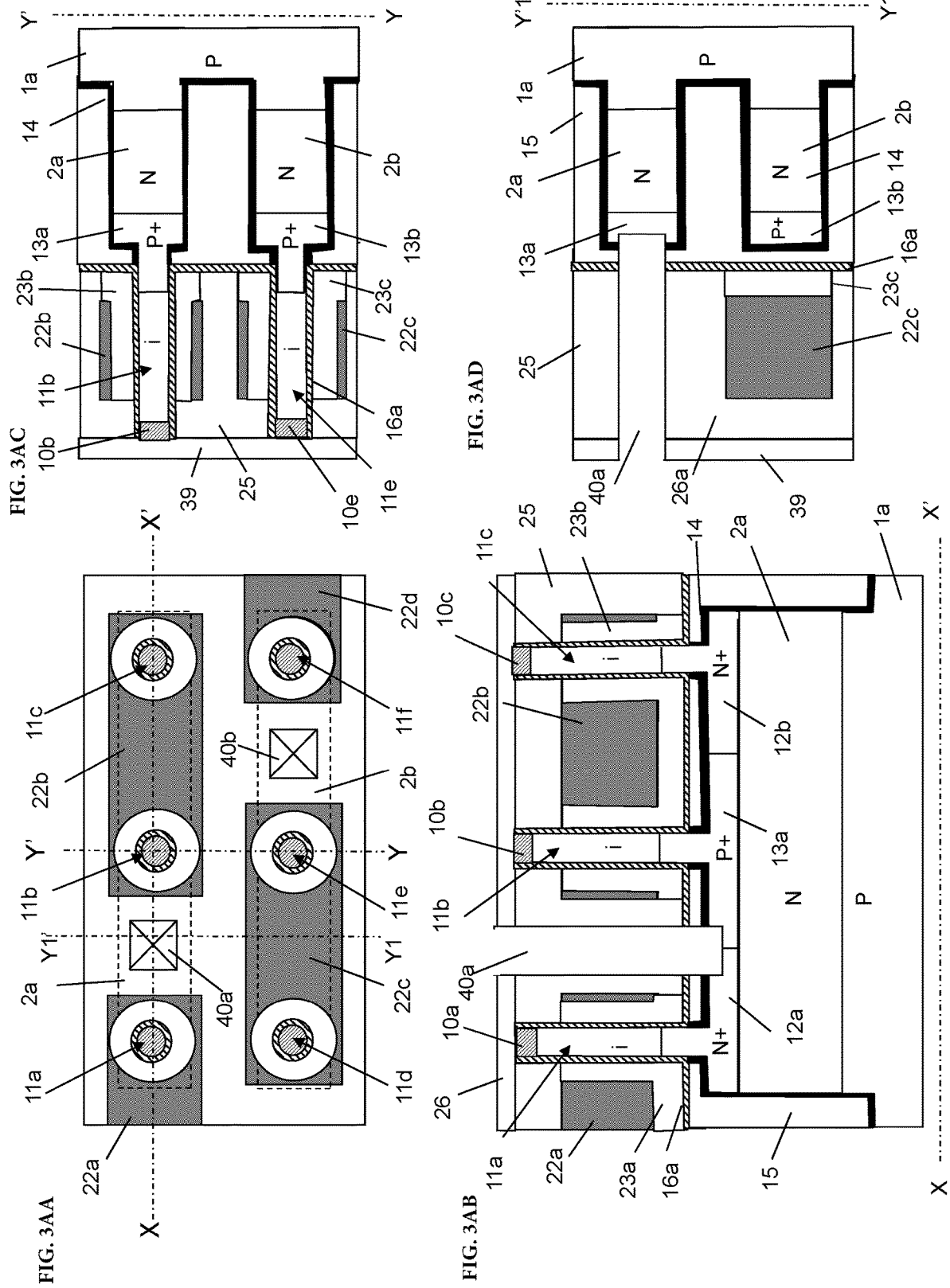

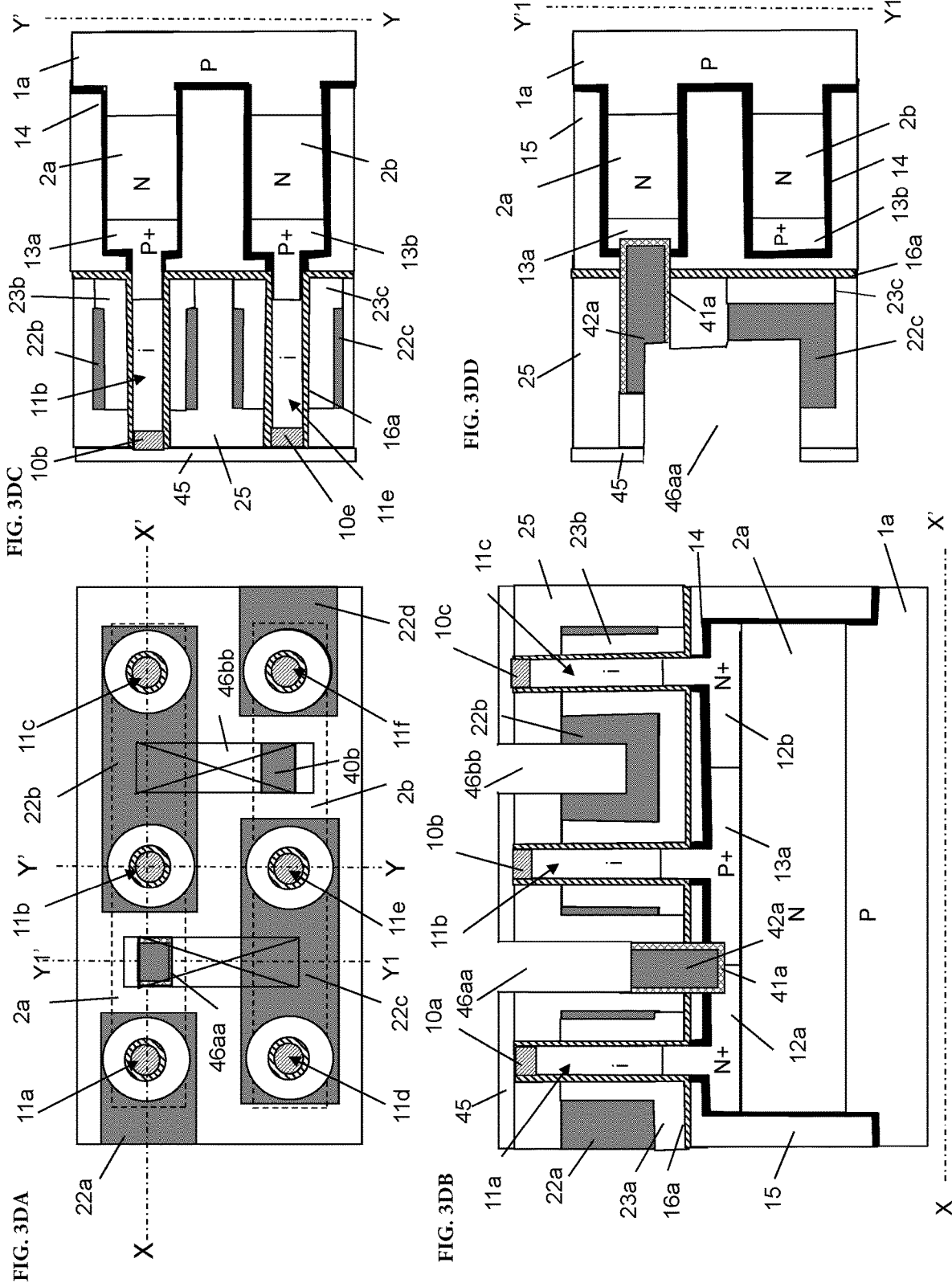

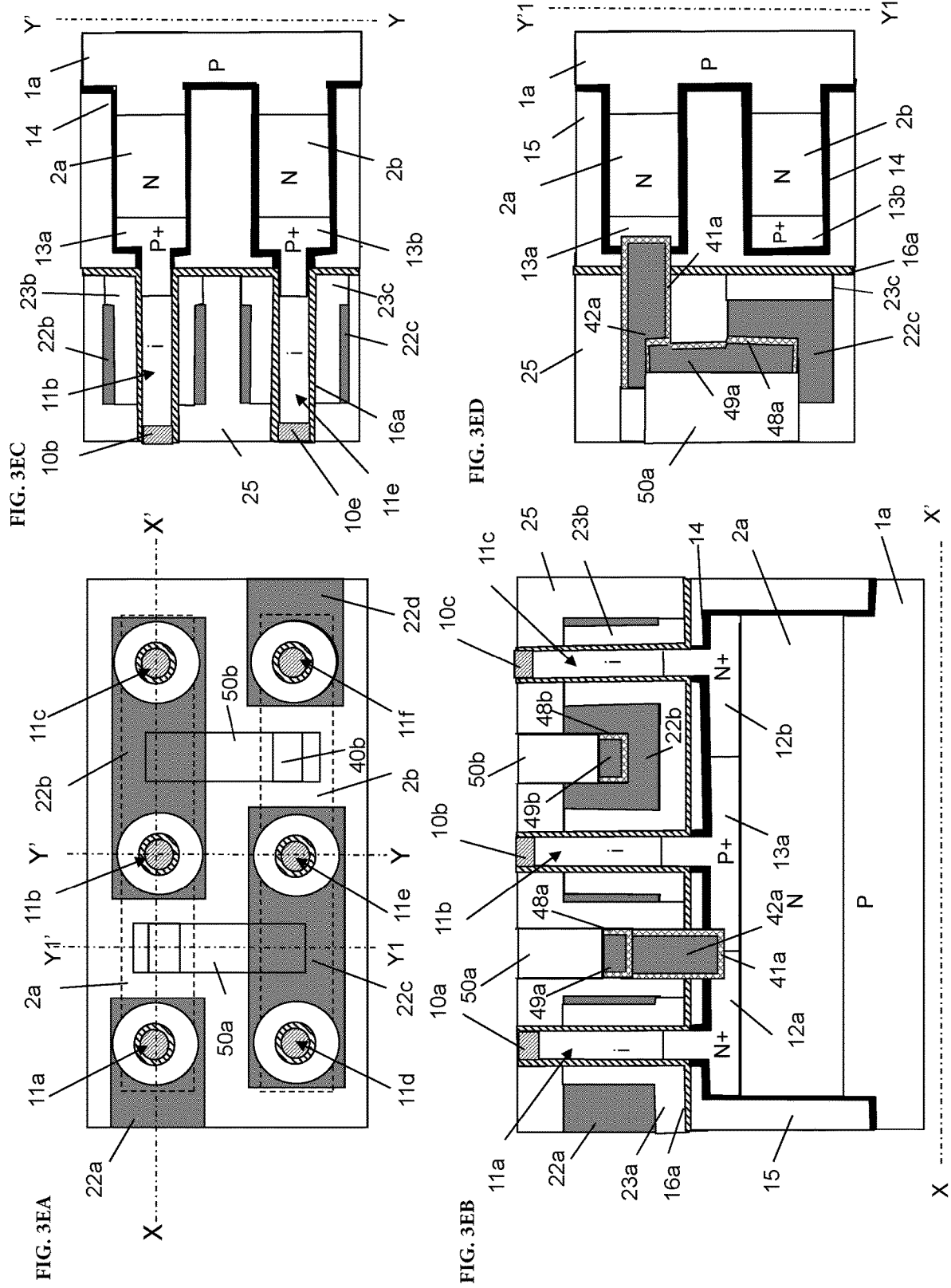

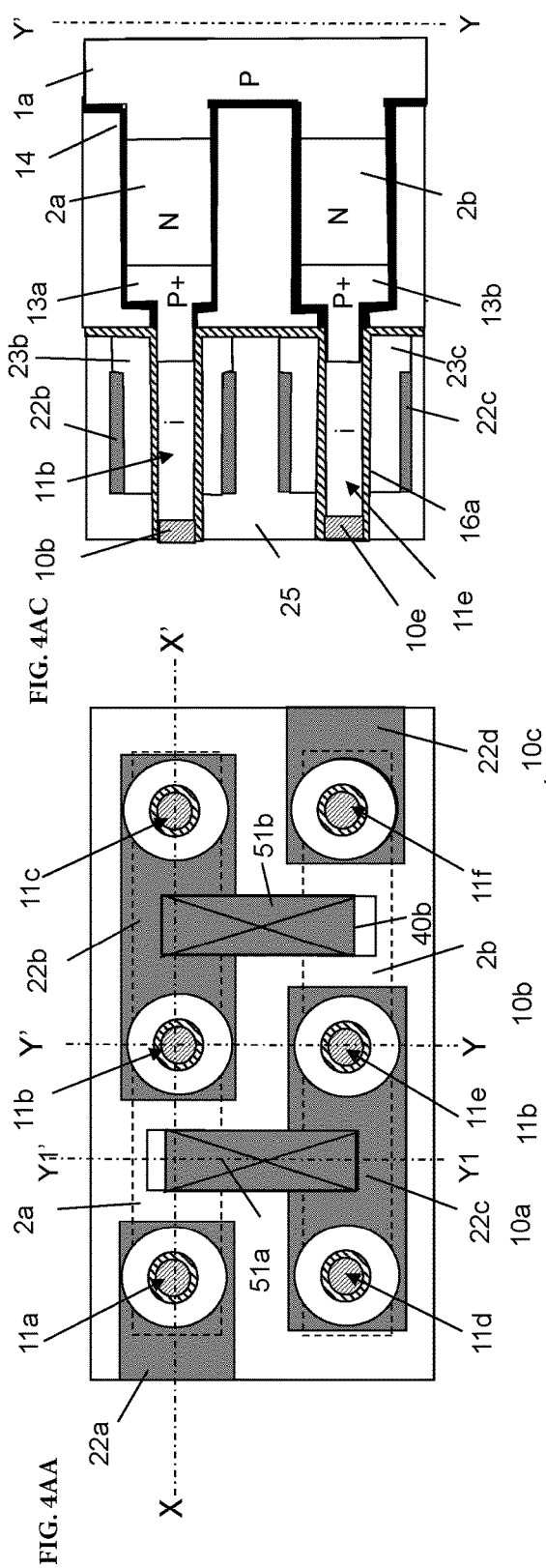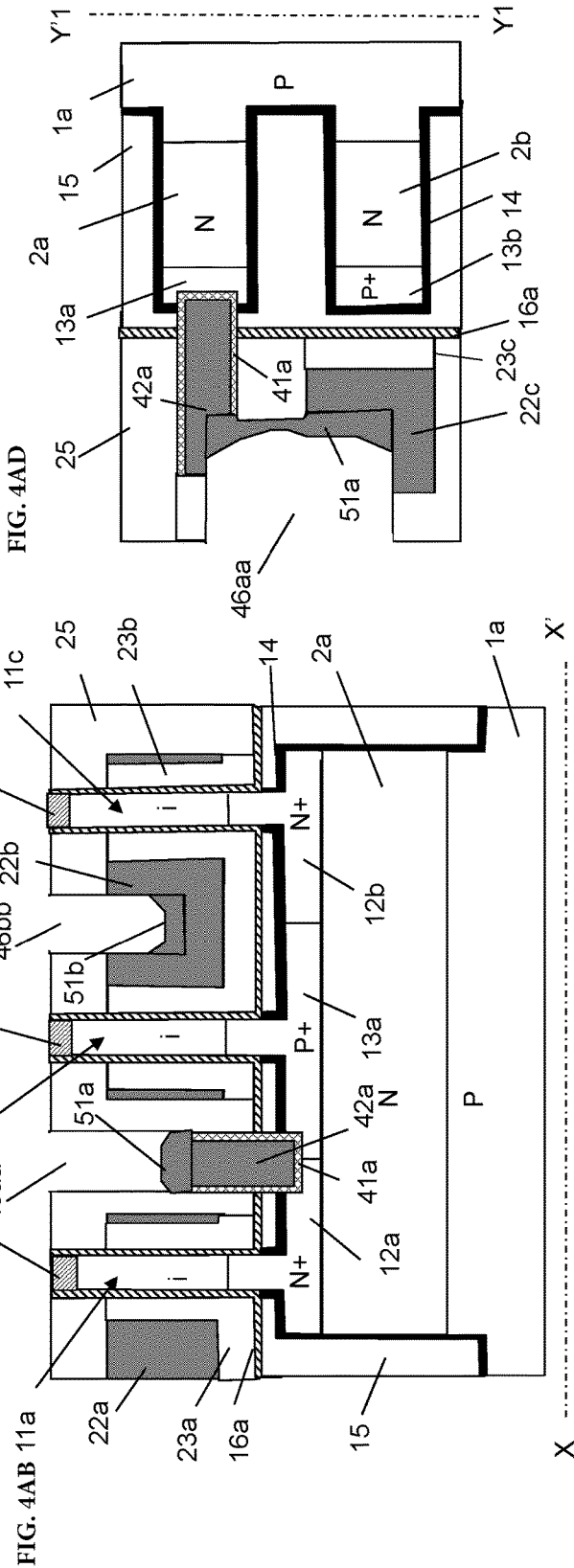

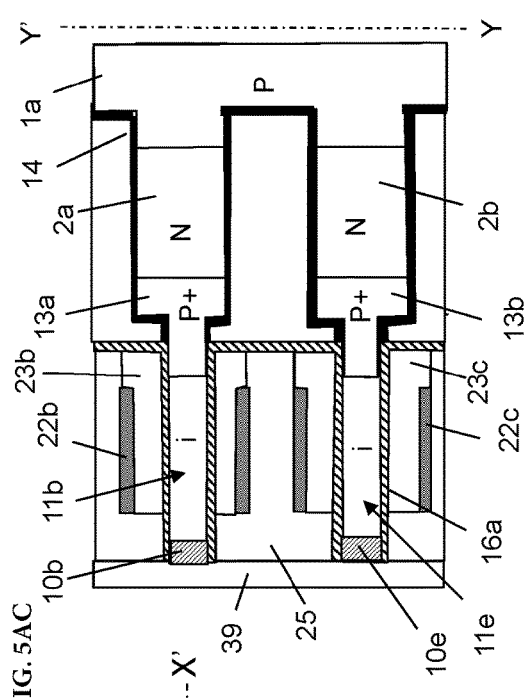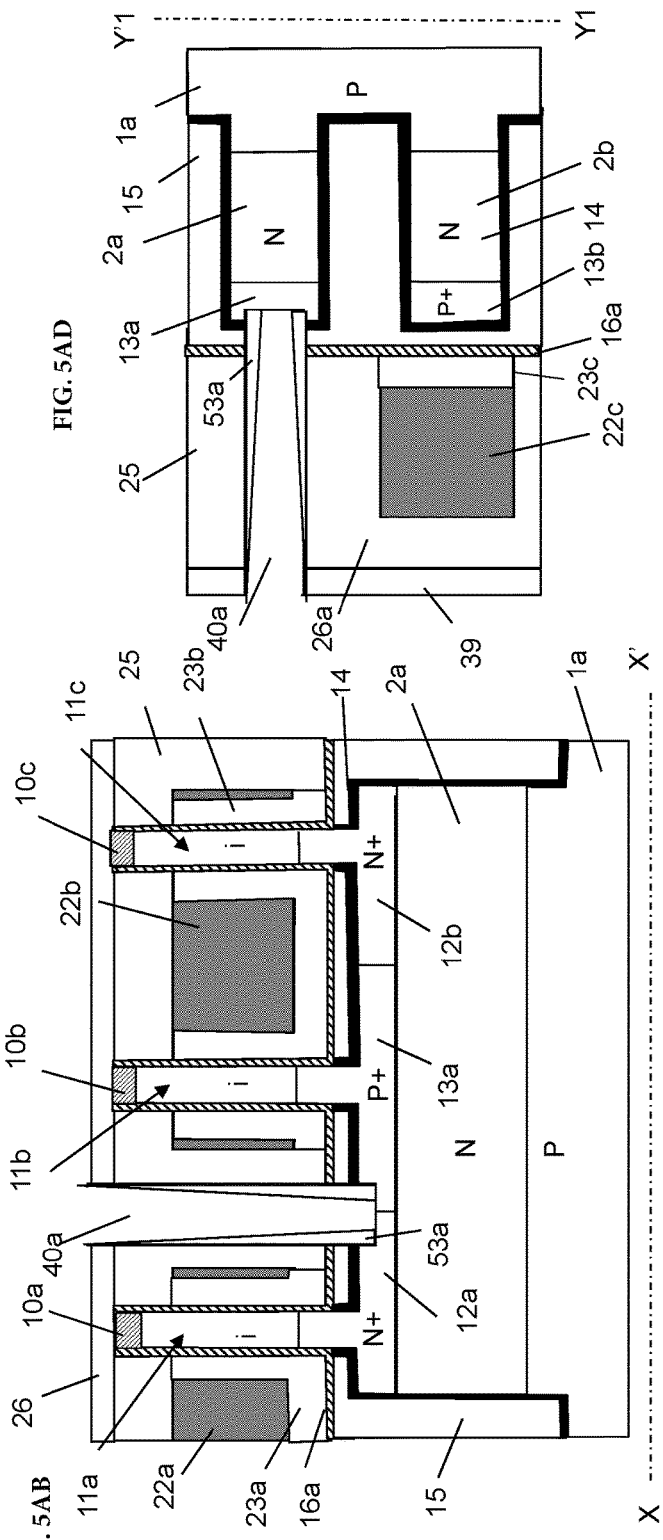

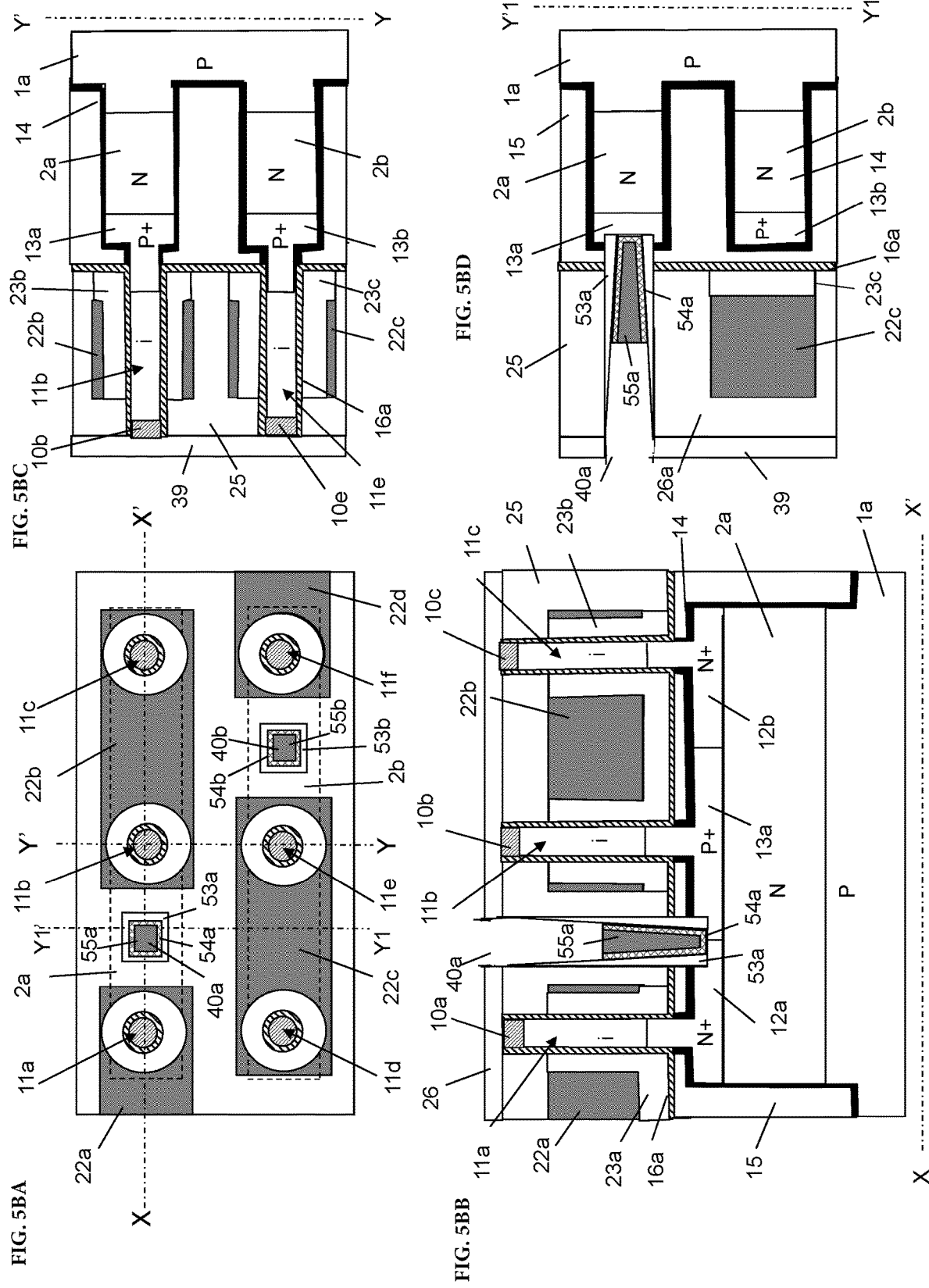

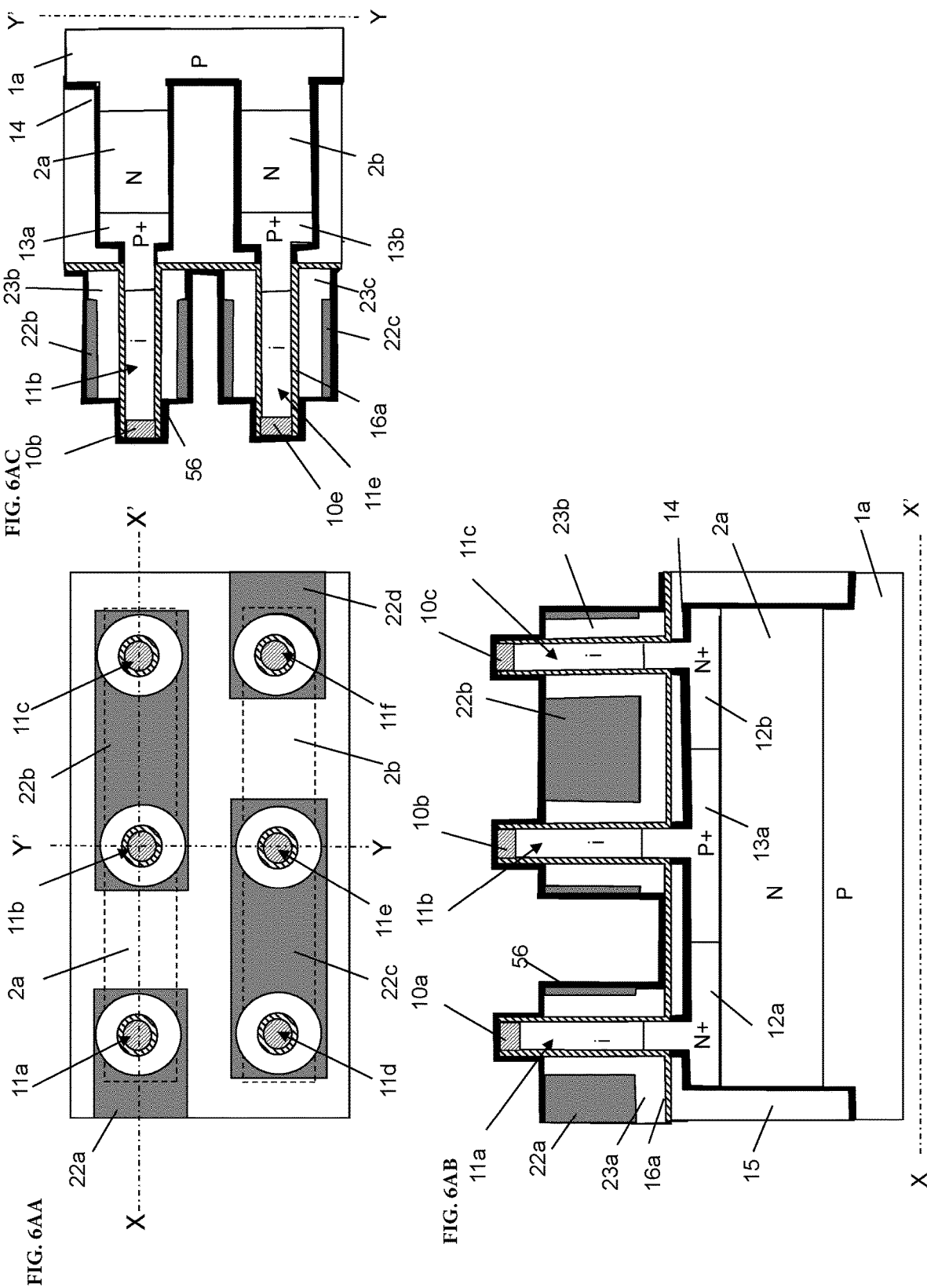

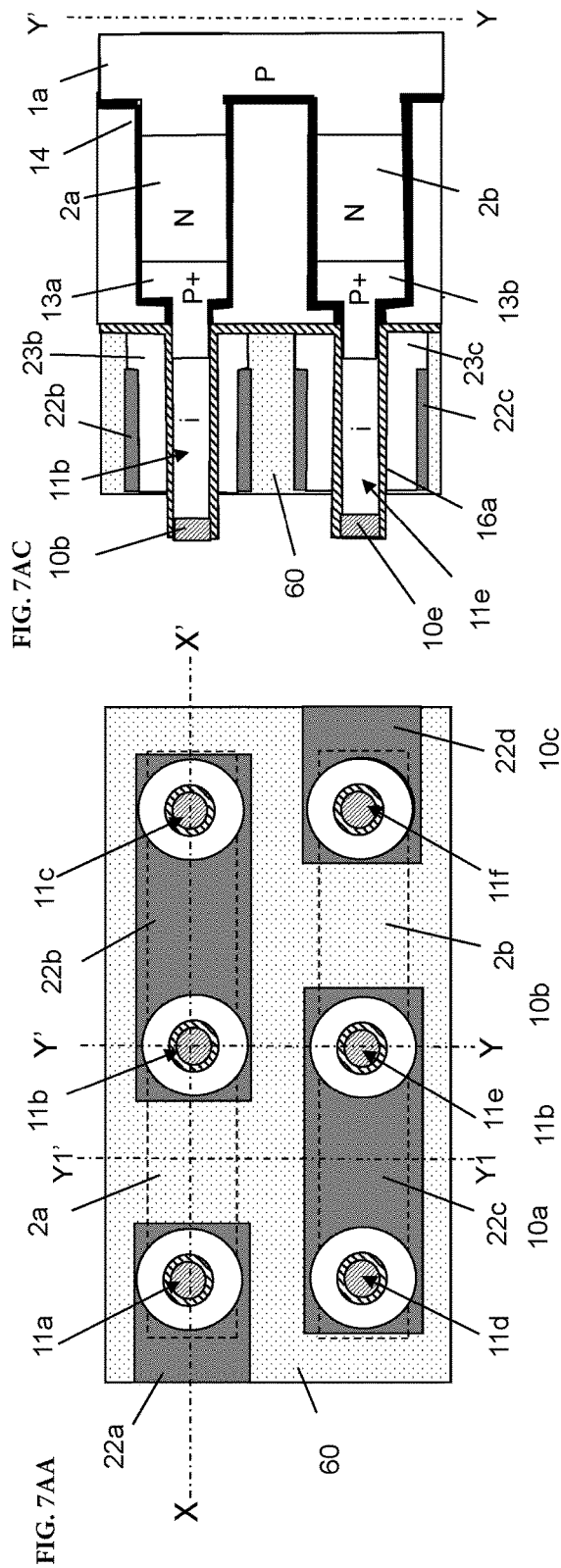
FIG. 7AA
FIG. 7AB
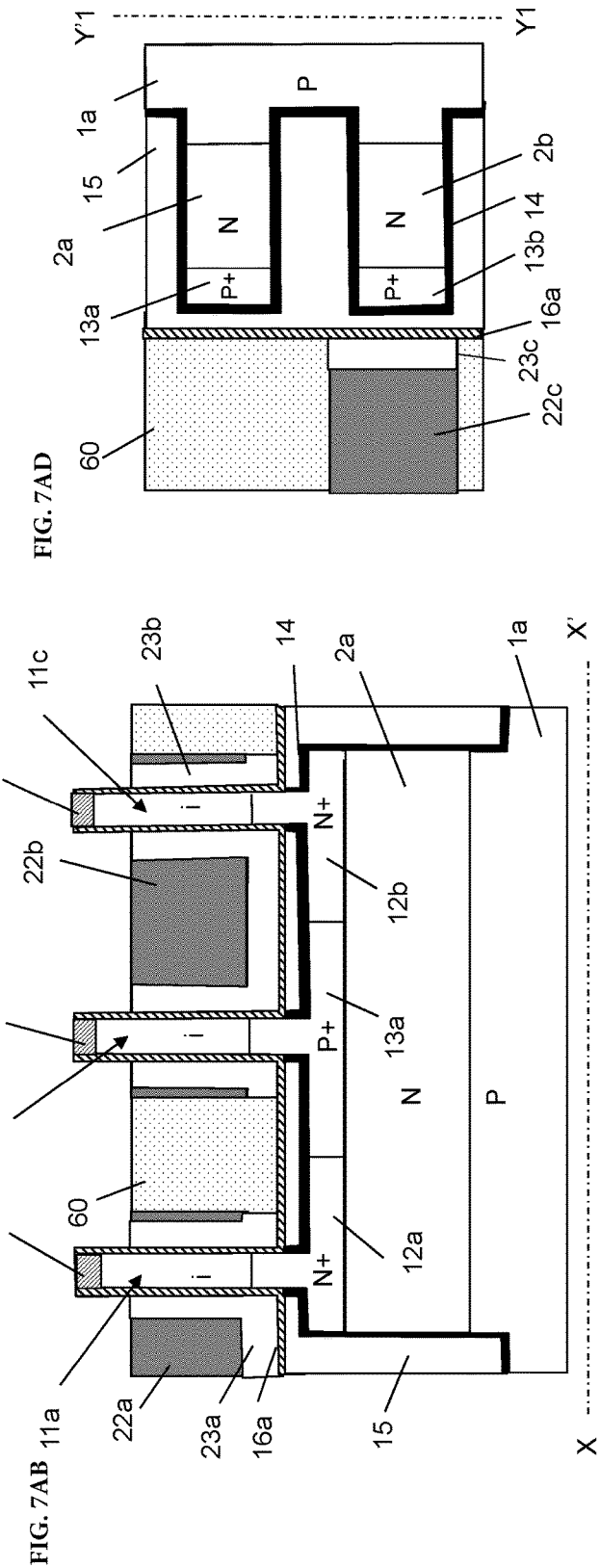
FIG. 7AC
FIG. 7AD

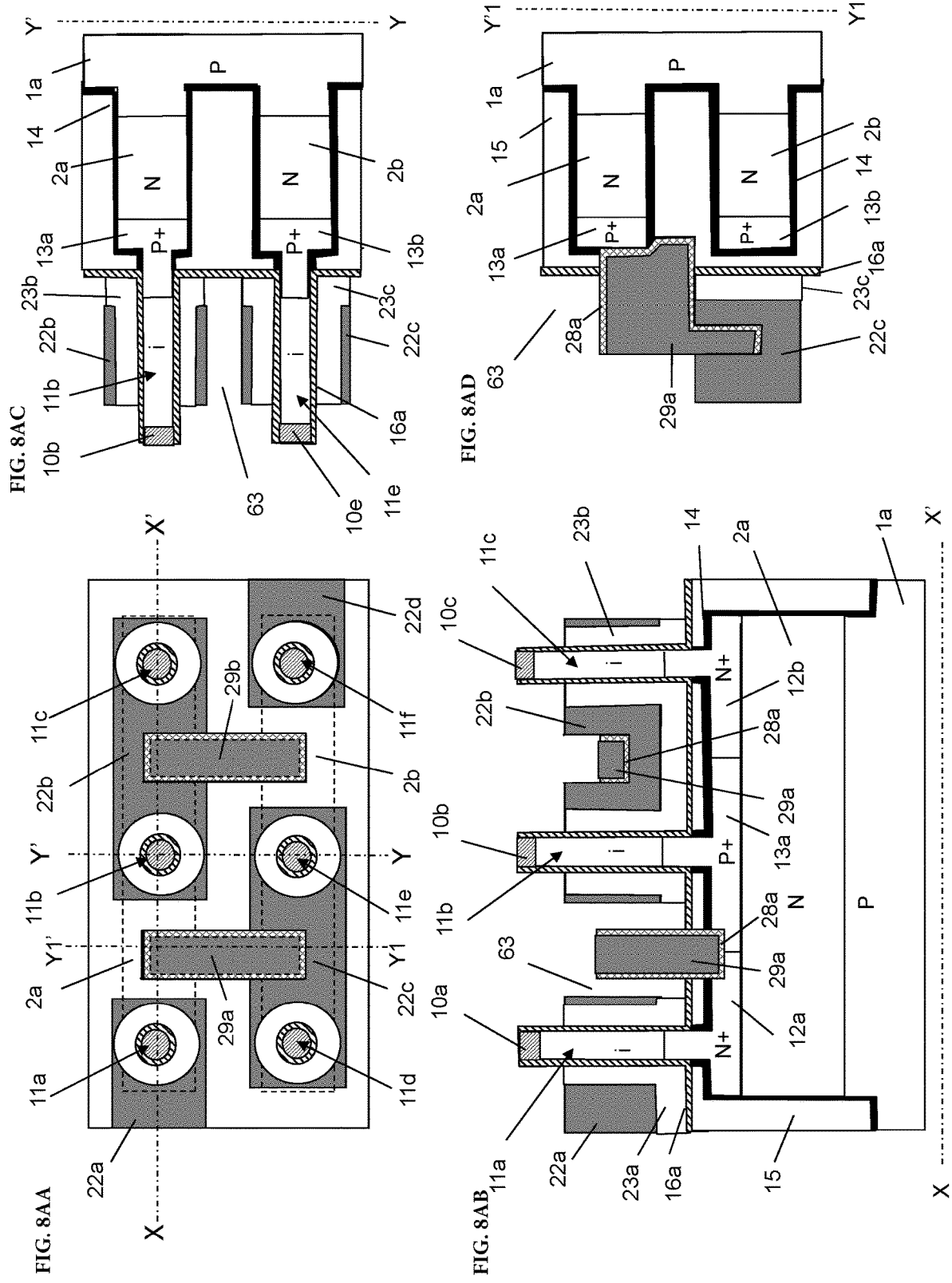

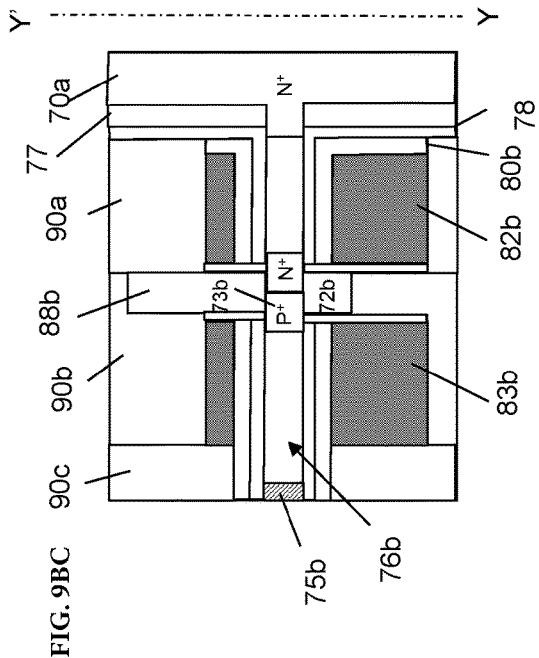
FIG. 9BC
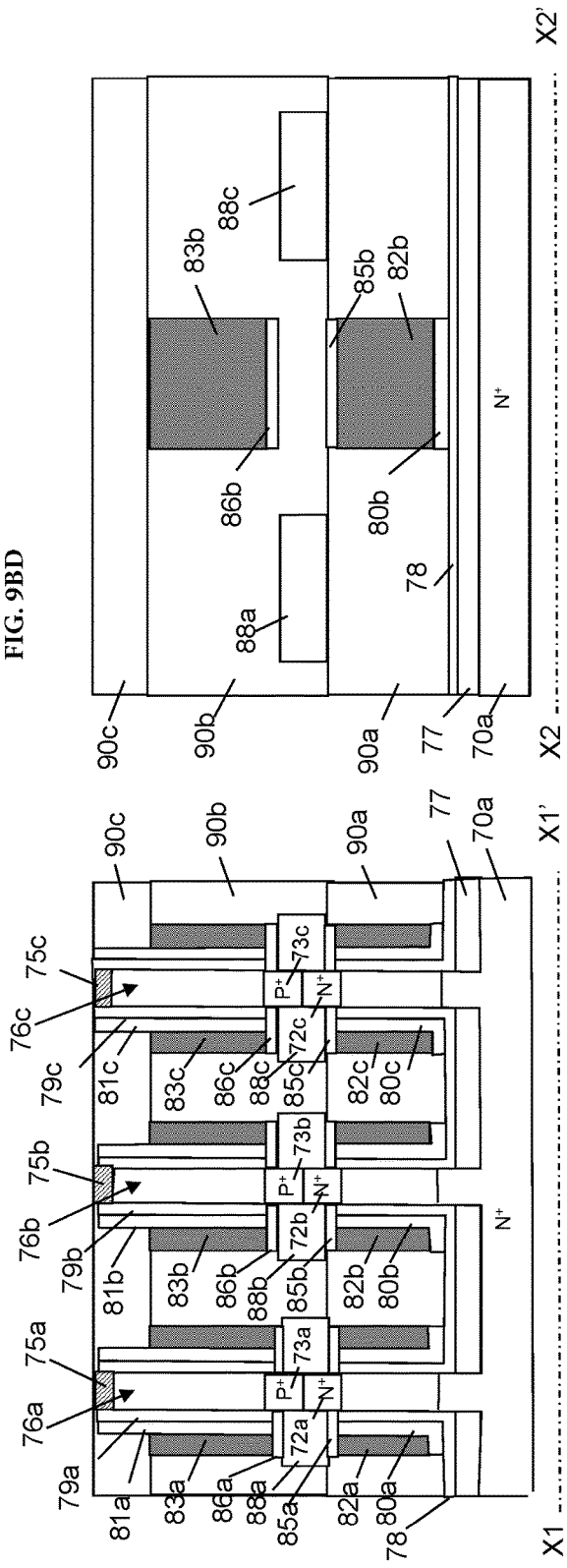
FIG. 9BD
FIG. 9BA
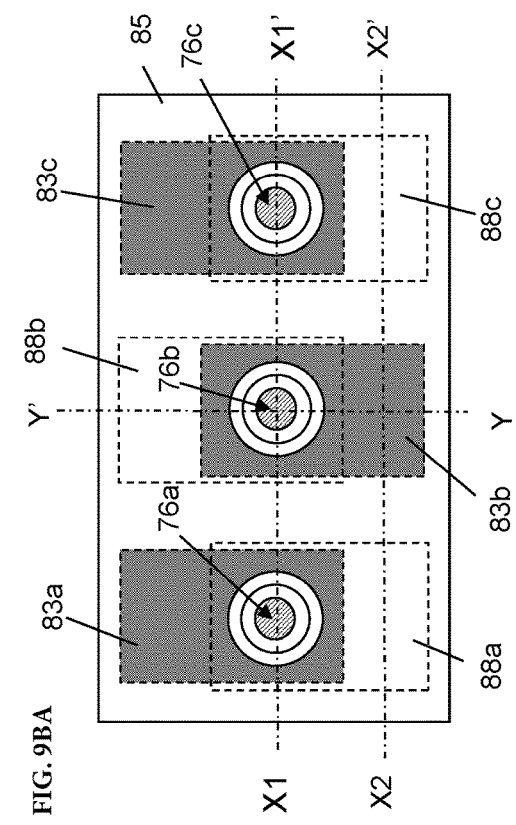
FIG. 9BB

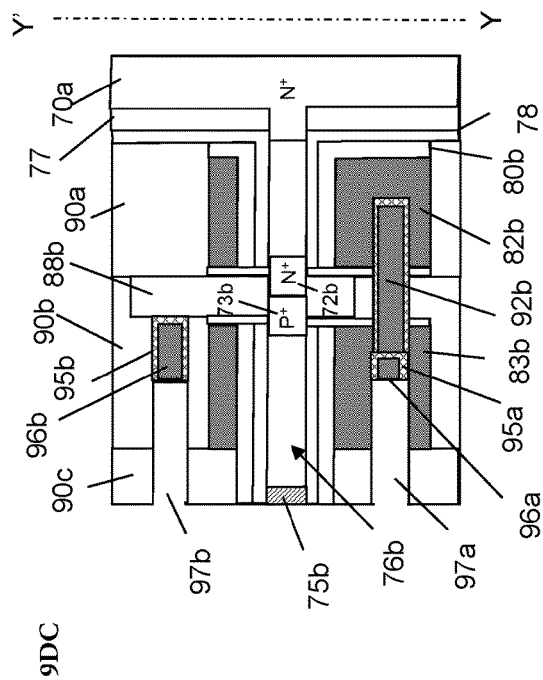
FIG. 9DA
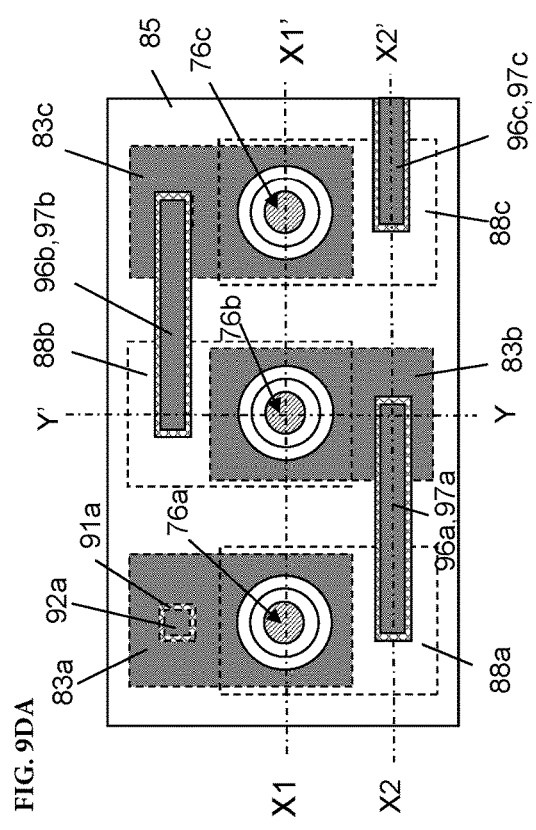
FIG. 9DB
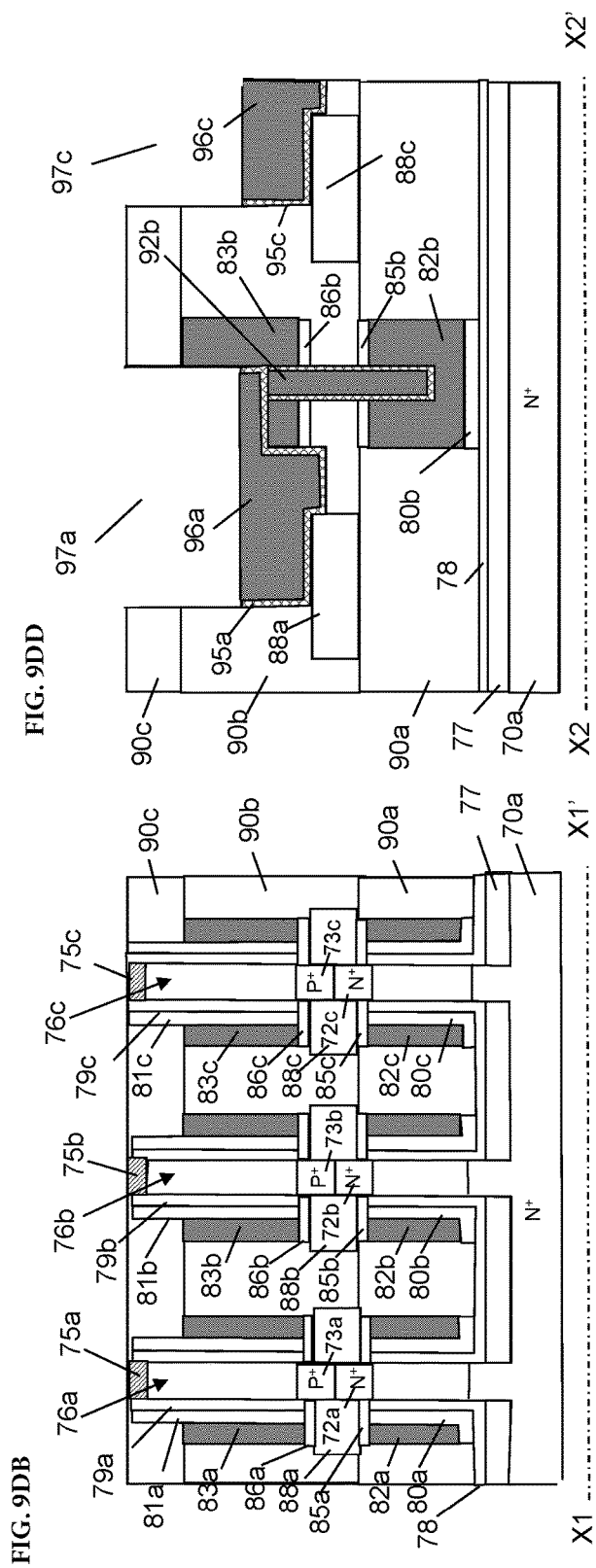
FIG. 9DC
FIG. 9DD

PILLAR-SHAPED SEMICONDUCTOR DEVICE AND METHOD FOR PRODUCING THE SAME

RELATED APPLICATIONS

The present application is a continuation application of PCT/JP2017/039538, filed Nov. 1, 2017, the entire contents of which are incorporated herein by reference.

BACKGROUND OF THE INVENTION

1. Field of the Invention

The present invention relates to a pillar-shaped semiconductor device and a method for producing the pillar-shaped semiconductor device.

2. Description of the Related Art

In these years, SGTs (Surrounding Gate Transistors), which represent pillar-shaped semiconductor devices, have been attracting attention as semiconductor elements that provide highly integrated semiconductor devices. There has been a demand for an SGT-including semiconductor memory device that has a higher degree of integration and a higher performance.

Ordinary planar MOS transistors have a channel that is present in a horizontal direction along the upper surface of the semiconductor substrate. By contrast, SGTs have a channel that is present in a direction perpendicular to the upper surface of the semiconductor substrate (for example, refer to Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). For this reason, compared with planar MOS transistors, SGTs enable an increase in the density of semiconductor devices.

FIG. 10 is a schematic structural view of an N-channel SGT. A Si pillar 100 of a P or i (intrinsic) conductivity type (hereafter, silicon semiconductor pillars will be referred to as "Si pillars") has, in its upper and lower portions, $N^+$ regions 101a and 101b one of which functions as a source and the other one of which functions as a drain (hereafter, semiconductor regions containing a donor impurity at a high concentration will be referred to as "$N^+$ regions"). A portion of the Si pillar 100 between the $N^+$ regions 101a and 101b, which function as a source and a drain, functions as a channel region 102. Around this channel region 102, a gate insulating material layer 103 is formed. Around this gate insulating material layer 103, a gate conductor layer 104 is formed. In the SGT, the $N^+$ regions 101a and 101b functioning as the source and the drain, the channel region 102, the gate insulating material layer 103, and the gate conductor layer 104 are formed within a single Si pillar 100. Thus, in plan view, the area occupied by the SGT corresponds to the area occupied by a single source-or-drain $N^+$ region of a planar MOS transistor. Therefore, compared with a circuit chip including a planar MOS transistor, an SGT-including circuit chip enables a further reduction in the size of the chip.

A large number of SGTs illustrated in FIG. 10 are formed on actual LSI circuit chips. The source, the drain, and the gate conductor layer of each SGT are connected to, in accordance with the circuit design, the source, the drain, and the gate conductor layer of another SGT, or wiring connecting to the outer circuit. The way of establishing this connection considerably affects the degree of integration, performance, and ease of production of the LSI circuit chip.

SUMMARY OF THE INVENTION

There has been a demand for achievement of a higher density, a higher performance, and a reduction in the cost of SGT-including LSI circuits.

A pillar-shaped semiconductor device according to a first aspect of the present invention includes: a first semiconductor pillar disposed on, in a direction perpendicular to, a substrate; a first impurity region present below the first semiconductor pillar; a first impurity region connection layer connecting to the first impurity region, extending in a horizontal direction, and being formed of a semiconductor or a conductor; a second impurity region present above the first semiconductor pillar; a first gate insulating layer surrounding the first semiconductor pillar between the first impurity region and the second impurity region; a first gate conductor layer surrounding the first insulating layer; a second semiconductor pillar disposed on, in the direction perpendicular to, the substrate; a third impurity region present below the second semiconductor pillar; a fourth impurity region present above the second semiconductor pillar; a second gate insulating layer surrounding the second semiconductor pillar between the third impurity region and the fourth impurity region; a second gate conductor layer surrounding the gate insulating layer; a second gate connection conductor layer connecting to the second gate conductor layer, extending in a horizontal direction, and being formed of a conductor; a first contact hole connecting to the first impurity region connection layer and the second gate connection conductor layer, and having a portion overlapping, in plan view, at least the second gate connection conductor layer, the portion having a bottom portion positioned, in the perpendicular direction, lower than upper surfaces of the second gate conductor layer and the second gate connection conductor layer; and a first connection conductor layer being present within the first contact hole and connecting to the first impurity region and the second gate connection conductor layer.

In the above-described pillar-shaped semiconductor device, desirably, an upper surface of the first connection conductor layer is positioned, in the perpendicular direction, lower than the upper surfaces of the second gate conductor layer and the second gate connection conductor layer.

In the above-described pillar-shaped semiconductor device, desirably, the second gate conductor layer and the second gate connection conductor layer are layers formed of an identical material.

In the above-described pillar-shaped semiconductor device, desirably, in plan view, the first contact hole includes a second contact hole present on the first impurity region connection layer or on the second gate connection conductor layer, and a third contact hole that connects to the second gate connection conductor layer when the second contact hole is on the first impurity region connection layer, or that connects to the first impurity region connection layer when the second contact hole is on the second gate connection conductor layer, the third contact hole has a bottom portion positioned lower than the upper surfaces of the second gate conductor layer and the second gate connection conductor layer, and the first connection conductor layer includes the second connection conductor layer within the second contact hole and the third connection conductor layer connecting to the second connection conductor layer and being present within the third contact hole.

The above-described pillar-shaped semiconductor device desirably includes: a first gate connection conductor layer connecting to the first gate conductor layer and extending in a horizontal direction; a first interlayer insulating layer surrounding side surfaces of the first gate connection conductor layer and the second gate connection conductor layer; and a second interlayer insulating layer surrounding a side surface of the first interlayer insulating layer, being formed of a material different from a material of the first interlayer insulating layer, and being used for formation of the first contact hole.

The above-described pillar-shaped semiconductor device desirably includes: a third interlayer insulating layer between a side surface of the first gate connection conductor layer, a side surface of the second gate connection conductor layer, and a side surface of the first connection conductor layer, the third interlayer insulating layer having a dielectric constant smaller than a dielectric constant of a silicon oxide film.

The above-described pillar-shaped semiconductor device desirably includes: a fourth interlayer insulating layer having a pore between one or both of a side surface of the first gate connection conductor layer and a side surface of the second gate connection conductor layer, and a side surface of the first connection conductor layer.

The above-described pillar-shaped semiconductor device desirably includes: a fourth contact hole connecting to a bottom of the third contact hole and connecting to a material layer being positioned lower than the third contact hole and being a semiconductor or conductive layer; and a fourth connection conductor layer within the fourth contact hole.

In the above-described pillar-shaped semiconductor device, the first contact hole desirably has a bottom portion within the first impurity region.

A method for producing a pillar-shaped semiconductor device according to a second aspect of the present invention, the pillar-shaped semiconductor device including a first impurity region, a first semiconductor pillar, and a second impurity region that are disposed, in a hierarchical manner, in a direction perpendicular to, on a substrate; a third impurity region, a second semiconductor pillar, and a fourth impurity region that are disposed, in a hierarchical manner, in the direction perpendicular to, on the substrate, the first impurity region being disposed below the first semiconductor pillar, the third impurity region being disposed below the second semiconductor pillar; and a first impurity region connection layer formed of a semiconductor or a conductor, connecting to the first impurity region, and extending in a horizontal direction, the method including: a step of forming a first gate insulating layer so as to surround the first semiconductor pillar; a step of forming a second gate insulating layer so as to surround the second semiconductor pillar; a step of forming a first gate conductor layer so as to surround the first gate insulating layer; a step of forming a second gate conductor layer so as to surround the second gate insulating layer; a step of forming a second gate connection conductor layer connecting to the second gate conductor layer and extending in a horizontal direction; a step of forming a first contact hole connecting to the first impurity region connection layer and the second gate connection conductor layer, and, in plan view, having a portion overlapping at least the second gate conductor layer, the portion having a bottom portion positioned, in the perpendicular direction, lower than upper surfaces of the second gate conductor layer and the second gate connection conductor layer; and a step of forming a first connection conductor layer within the first contact hole so as to connect to the first impurity region and the second gate connection conductor layer.

In the above-described method, desirably, the first connection conductor layer is formed so as to have an upper surface positioned, in the perpendicular direction, lower than upper surfaces of the second gate conductor layer and the second gate connection conductor layer.

In the above-described method, desirably, the second gate conductor layer and the second gate connection conductor layer are formed as layers of an identical material.

The above-described method desirably includes: a step of forming a second contact hole on the first impurity region connection layer; a step of forming a second connection conductor layer within the second contact hole; a step of forming a third contact hole on and connecting to the second contact hole and the second gate connection conductor layer; and a step of forming a third connection conductor layer within the third contact hole, the second contact hole and the third contact hole together forming the first contact hole, the second connection conductor layer and the third connection conductor layer together forming the first connection conductor layer.

The above-described method desirably includes: a step of forming a fourth contact hole on the second gate connection conductor layer; a step of forming a fourth connection conductor layer within the fourth contact hole; a step of forming a fifth contact hole on and connecting to the fourth contact hole and the first impurity connection layer; and a step of forming a fifth connection conductor layer within the fifth contact hole, the fourth contact hole and the fifth contact hole together forming the first contact hole, and the fourth connection conductor layer and the fifth connection conductor layer together forming the first connection conductor layer.

The above-described method desirably includes: a step of forming a first interlayer insulating layer surrounding side surfaces of the first gate connection conductor layer and the second gate connection conductor layer; and a step of forming a second interlayer insulating layer surrounding a side surface of the first interlayer insulating layer, formed of a material different from a material of the first interlayer insulating layer, and providing a higher etching rate than the first interlayer insulating layer with an etching species for forming the first contact hole.

The above-described method desirably includes: a step of forming a third interlayer insulating layer surrounding a side surface of the first connection conductor layer, and having a smaller relative dielectric constant than a silicon oxide film.

The above-described method desirably includes: a step of forming a fourth interlayer insulating layer surrounding the first connection conductor layer and having a pore therein.

The above-described method desirably includes: a step of forming a sixth contact hole connecting to a bottom of the third contact hole, and connecting to a material layer being positioned lower than the third contact hole and being a semiconductor or conductive layer; and a sixth connection conductor layer within the third contact hole and the sixth contact hole.

The above-described method desirably includes: a step of forming a seventh contact hole connecting to a bottom of the fourth contact hole, and connecting to a material layer being positioned lower than the fourth contact hole and being a semiconductor or conductive layer; and a step of forming a seventh connection conductor layer within the fourth contact hole and the seventh contact hole.

In the above-described method, the first contact hole desirably has a bottom portion within the first impurity region connection layer.

According to the present invention, in an SGT-including pillar-shaped semiconductor memory device, a single memory cell is constituted by at least three semiconductor pillars and a small number of contact holes that connect wiring layers within the memory cell. As a result, a high-density SRAM cell circuit can be achieved.

BRIEF DESCRIPTION OF THE DRAWINGS

FIG. 2AA is a plan view and FIGS. 2AB and 2AC are sectional structural views that illustrate a method for producing the SGT-including pillar-shaped semiconductor memory device according to the first embodiment.

FIG. 2BA is a plan view and FIGS. 2BB and 2BC are sectional structural views that illustrate a method for producing the SGT-including pillar-shaped semiconductor memory device according to the first embodiment.

FIG. 2CA is a plan view and FIGS. 2CB and 2CC are sectional structural views that illustrate a method for producing the SGT-including pillar-shaped semiconductor memory device according to the first embodiment.

FIG. 2DA is a plan view and FIGS. 2DB and 2DC are sectional structural views that illustrate a method for producing the SGT-including pillar-shaped semiconductor memory device according to the first embodiment.

FIG. 2EA is a plan view and FIGS. 2EB and 2EC are sectional structural views that illustrate a method for producing the SGT-including pillar-shaped semiconductor memory device according to the first embodiment.

FIG. 2FA is a plan view and FIGS. 2FB and 2FC are sectional structural views that illustrate a method for producing the SGT-including pillar-shaped semiconductor memory device according to the first embodiment.

FIG. 2GA is a plan view and FIGS. 2GB to 2GD are sectional structural views that illustrate a method for producing the SGT-including pillar-shaped semiconductor memory device according to the first embodiment.

FIG. 2IA is a plan view and FIGS. 2IB to 2ID are sectional structural views that illustrate a method for producing the SGT-including pillar-shaped semiconductor memory device according to the first embodiment.

FIG. 2JA is a plan view and FIGS. 2JB to 2JD are sectional structural views that illustrate a method for producing the SGT-including pillar-shaped semiconductor memory device according to the first embodiment.

FIG. 2KA is a plan view and FIGS. 2KB to 2KD are sectional structural views that illustrate a method for producing the SGT-including pillar-shaped semiconductor memory device according to the first embodiment.

FIG. 3AA is a plan view and FIGS. 3AB to 3AD are sectional structural views that illustrate a method for producing an SGT-including pillar-shaped semiconductor memory device according to a second embodiment of the present invention.

FIG. 3DA is a plan view and FIGS. 3DB to 3DD are sectional structural views that illustrate a method for producing the SGT-including pillar-shaped semiconductor memory device according to the second embodiment.

FIG. 3EA is a plan view and FIGS. 3EB to 3ED are sectional structural views that illustrate a method for producing the SGT-including pillar-shaped semiconductor memory device according to the second embodiment.

FIG. 4AA is a plan view and FIGS. 4AB to 4AD are sectional structural views that illustrate a method for producing an SGT-including pillar-shaped semiconductor memory device according to a second embodiment of the present invention.

FIG. 5AA is a plan view and FIGS. 5AB to 5AD are sectional structural views that illustrate a method for producing an SGT-including pillar-shaped semiconductor memory device according to a second embodiment of the present invention.

FIG. 5BA is a plan view and FIGS. 5BB to 5BD are sectional structural views that illustrate a method for producing the SGT-including pillar-shaped semiconductor memory device according to the second embodiment.

FIG. 6AA is a plan view and FIGS. 6AB and 6AC are sectional structural views that illustrate a method for producing an SGT-including pillar-shaped semiconductor memory device according to a second embodiment of the present invention.

FIG. 7AA is a plan view and FIGS. 7AB to 7AD are sectional structural views that illustrate a method for producing an SGT-including pillar-shaped semiconductor memory device according to a second embodiment of the present invention.

FIG. 8AA is a plan view and FIGS. 8AB to 8AD are sectional structural views that illustrate a method for producing an SGT-including pillar-shaped semiconductor memory device according to a second embodiment of the present invention.

FIG. 9BA is a plan view and FIGS. 9BB to 9BD are sectional structural views that illustrate a method for producing the SGT-including inverter chain circuit device according to the first embodiment.

FIG. 9DA is a plan view and FIGS. 9DB to 9DD are sectional structural views that illustrate a method for producing the SGT-including inverter chain circuit device according to the first embodiment.

DETAILED DESCRIPTION OF THE PREFERRED EMBODIMENTS

Hereinafter, methods for producing SGT-including pillar-shaped semiconductor memory devices according to embodiments of the present invention will be described with reference to drawings.

First Embodiment

Hereinafter, a method for producing an SRAM cell that is an SGT-including pillar-shaped semiconductor memory device, according to a first embodiment of the present invention, will be described with reference to FIG. 1 and FIG. 2AA to FIG. 2KD.

Figure 1:
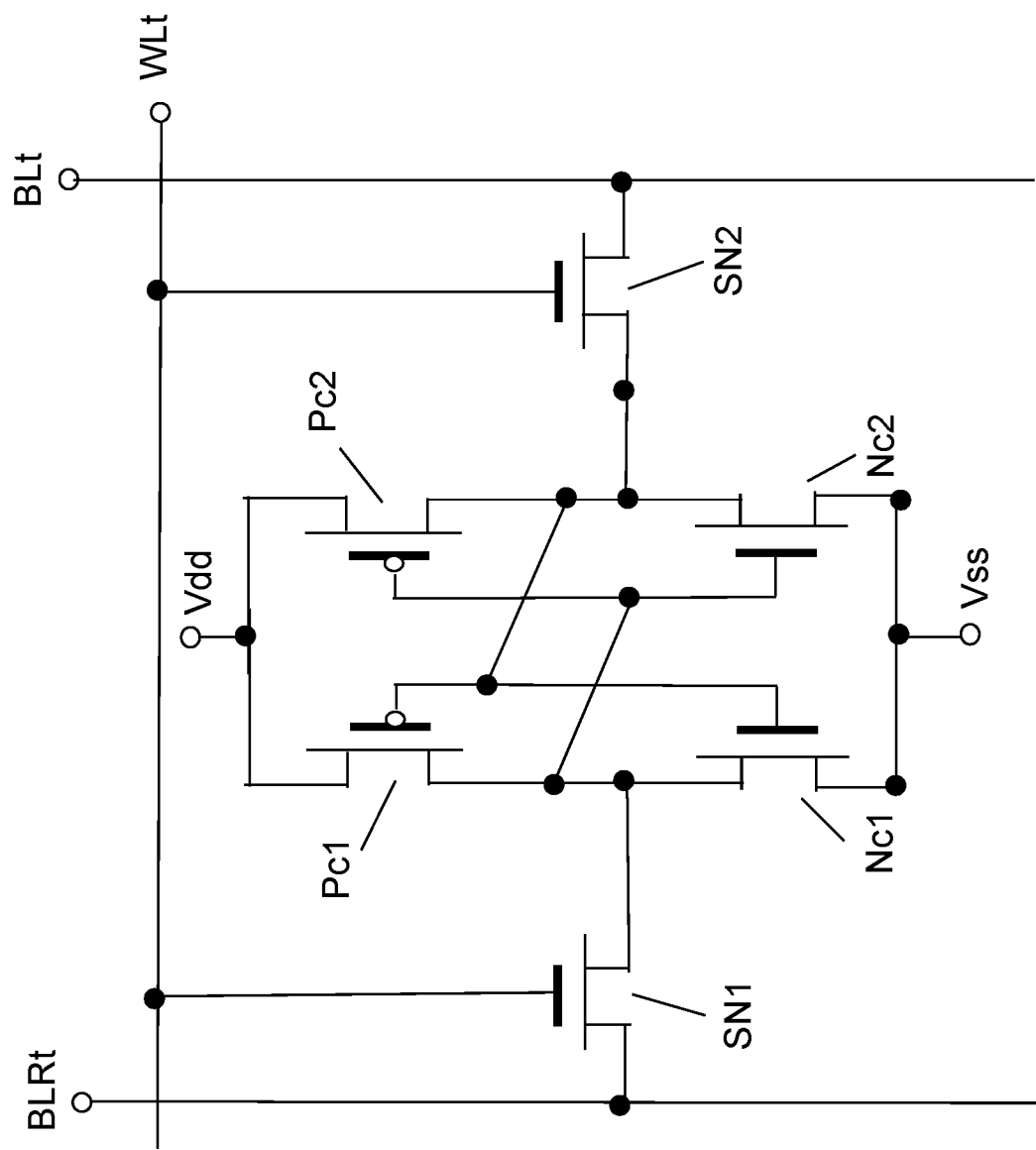
FIG. 1 is an SRAM cell circuit diagram for illustrating an SGT-including pillar-shaped semiconductor memory device according to a first embodiment of the present invention.

FIG. 1 is an equivalent circuit diagram of the SRAM cell structure of this embodiment. This SRAM cell circuit includes two inverter circuits. One of the inverter circuits is constituted by a P-channel SGT Pc1 serving as a load transistor, and an N-channel SGT Nc1 serving as a drive transistor. The other inverter circuit is constituted by a P-channel SGT Pc2 serving as a load transistor, and an N-channel SGT Nc2 serving as a drive transistor. The gate of the P-channel SGT Pc1 and the gate of the N-channel SGT Nc1 are connected together. The drain of the P-channel SGT Pc2 and the drain of the N-channel SGT Nc2 are connected together. The gate of the P-channel SGT Pc2 and the gate of the N-channel SGT Nc2 are connected together. The drain of the P-channel SGT Pc1 and the drain of the N-channel SGT Nc1 are connected together.

As illustrated in FIG. 1, the sources of the P-channel SGTs Pc1 and Pc2 are connected to a power supply terminal Vdd. The sources of the N-channel SGTs Nc1 and Nc2 are connected to a ground terminal Vss. Selection N-channel SGTs SN1 and SN2 are disposed on both sides of the two inverter circuits. The gates of the selection N-channel SGTs SN1 and SN2 are connected to a word line terminal WLt. The source and drain of the selection N-channel SGT SN1 are connected to the drains of the N-channel SGT Nc1 and the P-channel SGT Pc1 and a bit line terminal BLt. The source and drain of the selection N-channel SGT SN2 are connected to the drains of the N-channel SGT Nc2 and the P-channel SGT Pc2 and an inverted bit line terminal BLRt. Thus, the circuit including an SRAM cell (hereafter, referred to as an "SRAM cell circuit") according to this embodiment is constituted by, in total, six SGTs that are two P-channel SGTs Pc1 and Pc2 and four N-channel SGTs Nc1, Nc2, SN1, and SN2.

Hereinafter, a production flow will be described for an SRAM cell structure according to the first embodiment relating to the equivalent circuit of an SRAM cell illustrated in FIG. 1.

As illustrated in FIGS. 2AA to 2AC, on a P-layer substrate 1, an N layer 2 is first formed by an epitaxial growth process. Subsequently, in the surface layer of the N layer 2, $N^+$ layers 3a and 3b and a $P^+$ layer 4 are formed by an ion implantation process, for example. Subsequently, on the $N^+$ layers 3a and 3b and the $P^+$ layer 4, an i layer 5 is formed by an epitaxial growth process. Subsequently, on the i layer 5, an insulating material layer 6 is formed, which includes a silicon oxide ($SiO_2$) layer (not shown), a silicon nitride (SiN) layer (not shown), and a $SiO_2$ layer (not shown). Incidentally, the N layer 2 desirably has a donor impurity concentration higher than the acceptor impurity concentration of the P-layer substrate 1. The $N^+$ layers 3a and 3b and the $P^+$ layer 4, which serve as the sources or drains of the SGTs, desirably have a donor or acceptor impurity concentration as high as possible. The i layer 5 of an intrinsic conductivity type not containing acceptor or donor impurities may be replaced by a P layer or N layer containing a donor or acceptor impurity.

Subsequently, as illustrated in FIGS. 2BA to 2BC, a lithographic process and an RIE (Reactive Ion Etching) process for the insulating material layer 6 are carried out to form insulating material layers 6a and 6b on the i layer 5. Subsequently, through the insulating material layers 6a and 6b serving as masks, the i layer 5, the $N^+$ layers 3a and 3b, the $P^+$ layer 4, the N layer 2, and the P layer 1 are etched, to form a Si pillar base positioned under the insulating material layer 6a and including an i layer 5a, $N^+$ layers 3aa and 3bb, a $P^+$ layer 4a, an N layer 2a, and a P-layer substrate 1a, and a Si pillar base positioned under the insulating material layer 6b and including an i layer 5b, $N^+$ layers 3cc (not shown) and 3dd (not shown), a $P^+$ layer 4b, an N layer 2b, and a P-layer substrate 1a.

Subsequently, as illustrated in FIGS. 2CA to 2CC, a lithographic process and an RIE process are carried out to pattern the insulating material layer 6a, to form insulating material layers 10a, 10b, 10c, 10d (not shown), 10e, and 10f. Subsequently, through the insulating material layers 10a to 10f serving as masks, the insulating material layers 6a and 6b, the i layers 5a and 5b, and the $N^+$ layers 3aa, 3bb, 3cc, and 3dd are etched to form Si pillars 11a, 11b, 11c, 11d, 11e, and 11f. In the bottom portions of the Si pillars 11a to 11f, $N^+$ layers 12a, 12b, 12c (not shown), and 12d (not shown), and $P^+$ layers 13a and 13b are formed. The N layer 2a is thus formed under the $P^+$ layers 12a and 12b and over the P-layer substrate 1a. The N layer 2b is thus formed under the $N^-$ layers 12c and 12d and over the P-layer substrate 1a. Subsequently, a thin $SiO_2$ layer (not shown) is formed over the whole structure, and then a SiN layer (not shown) is formed so as to cover the whole structure. Subsequently, a $SiO_2$ layer 15 is formed on the outer peripheral portions of the Si pillars 11a to 11f so as to have an upper surface positioned higher than the upper surfaces of the $N^+$ layers 12a, 12b, 12c, and 12d and the $P^+$ layers 13a and 13b. Subsequently, portions of the SiN layer and the $SiO_2$ layer that surround, above the upper surface of the $SiO_2$ layer 15, Si pillars 11a to 11f are removed. Subsequently, for example, chemical cleaning is performed to form a thin $SiO_2$ layer (not shown) on the side surfaces of the Si pillars 11a to 11f. Subsequently, a hafnium oxide ($HfO_2$) layer 16 serving as a gate insulating material layer is formed over the whole structure by an ALD (Atomic Layer Deposition) process. Subsequently, a titanium nitride (TiN) layer 17 serving as a gate conductor layer is formed over the whole structure.

Subsequently, as illustrated in FIGS. 2DA to 2DC, a tungsten (W) film (not shown) is formed so as to have an upper surface positioned higher than the insulating material layers 10a to 10f. Subsequently, a CMP (Chemical Mechanical Polish) process is carried out to polish the W layer and the TiN layer 17 to form a W layer 20, a TiN layer 17a, and a HfO$_2$ layer 16a so as to have upper surfaces positioned at the same level as the upper surfaces of the insulating material layers 10a to 10f.

Subsequently, as illustrated in FIGS. 2EA to 2EC, an RIE (Reactive Ion Etching) process is carried out to subject the W layer 20 and the TiN layer 17a to etch back, to thereby form a W layer 20a and a TiN layer 17b.

Subsequently, as illustrated in FIGS. 2FA to 2FC, a lithographic process and an RIE process are carried out to form, in plan view, a W layer 22a and a TiN layer 23a, which surround the Si pillar 11a; a W layer 22b and a TiN layer 23b, which surround the Si pillars 11b and 11c; a W layer 22c and a TiN layer 23c, which surround the Si pillars 11d and 11e; and a W layer 22d and a TiN layer 23d (not shown), which surround the Si pillar 11f.

Subsequently, as illustrated in FIGS. 2GA to 2GD, a SiO$_2$ layer (not shown) is formed so as to cover the whole structure. Subsequently, a CMP process is carried out to polish the SiO$_2$ layer so as to have an upper surface positioned at the same level as the upper surfaces of the insulating layers 10a to 10f. As a result, a SiO$_2$ layer 25 is formed. Subsequently, a SiN layer 26 is formed over the whole structure. Subsequently, a lithographic process and an RIE process are carried out to etch the SiN layer 26 and the SiO$_2$ layer 25, to form a cavity 27a, which connects to, in plan view, the N$^+$ layer 12a, the P$^+$ layer 13a, and the W layer 22c; and a cavity 27b, which connects to, in plan view, the N$^+$ layer 12d, the P$^+$ layer 13b, and the W layer 22b; the cavities 27a and 27b have bottom portions at the upper surfaces of the W layers 22a to 22d. Incidentally, the bottom portions of the cavities 27a and 27b on the SiO$_2$ layer 25 are positioned lower than the upper surfaces of the W layers 22a to 22d due to overetching of the SiO$_2$ layer 25.

Figure 2H:
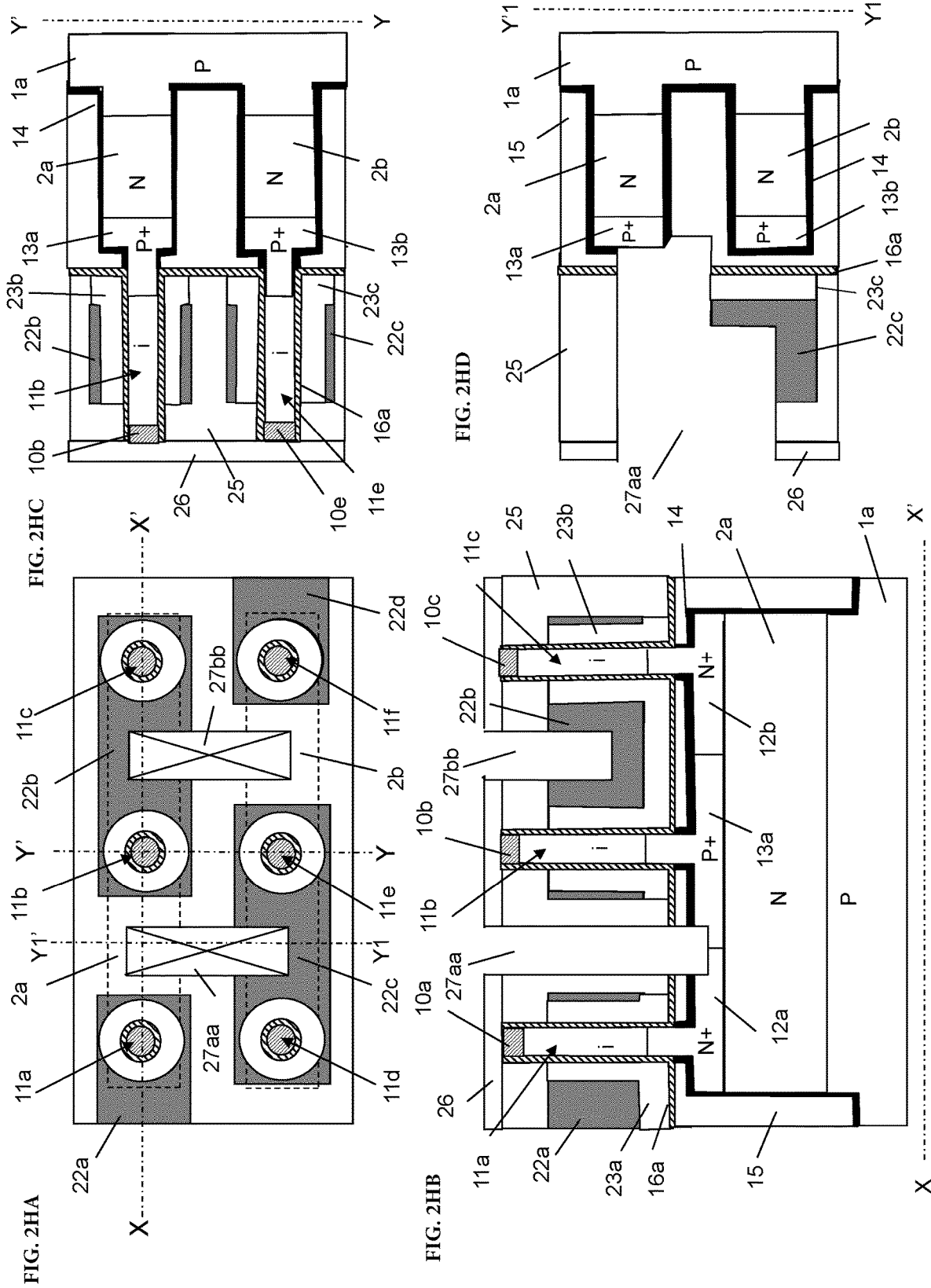
FIG. 2HA is a plan view and FIGS. 2HB to 2HD are sectional structural views that illustrate a method for producing the SGT-including pillar-shaped semiconductor memory device according to the first embodiment.

Subsequently, as illustrated in FIGS. 2HA to 2HD, the W layers 22a to 22d are further etched, and subsequently the SiO$_2$ layer 25 is further etched. As a result, a contact hole 27aa is formed so as to have a bottom portion that is positioned lower than the upper surface of the W layer 22c, that is positioned, in plan view, on the boundary between the N$^+$ layer 12a and the P$^+$ layer 13a, and that is positioned at the upper surfaces of the N$^+$ layer 12a and the P$^+$ layer 13a, or within the N$^-$ layer 12a and the P$^+$ layer 13a. Similarly, a contact hole 27bb is formed so as to have a bottom portion that is positioned lower than the upper surface of the W layer 22b, that is positioned, in plan view, on the boundary between the N$^+$ layer 12d and the P$^+$ layer 13b, and that is positioned at the upper surfaces of the N$^+$ layer 12d and the P$^-$ layer 13b, or within the N$^+$ layer 12d and the P$^+$ layer 13b.

Subsequently, as illustrated in FIGS. 2IA to 2ID, an ALD process is carried out to form, within the contact holes 27aa and 27bb, a barrier conductor layer (not shown) formed of Ti and TiN, for example. Subsequently, a W layer (not shown) is formed over the whole structure so as to have an upper surface positioned higher than the upper surfaces of the insulating material layers 10a to 10f and the SiO$_2$ layer 25. Subsequently, a CMP process is carried out to polish and remove the W layer and the barrier conductor layer on the SiO$_2$ layer 25. Subsequently, upper portions of the W layer and the barrier conductor layer within the contact holes 27aa and 27bb are etched off to form barrier conductor layers 28a and 28b and W layers 29a and 29b. As a result, the N$^+$ layer 12a, the P$^+$ layer 13a, and the W layer 22c are connected together through the barrier conductor layer 28a and the W layer 29a; and similarly, the N$^+$ layer 12d, the P$^+$ layer 13b, and the W layer 22b are connected together through the barrier conductor layer 28b and the W layer 29b. Subsequently, a SiO$_2$ layer (not shown) is formed over the whole structure so as to have an upper surface positioned higher than the upper surfaces of the insulating material layers 10a to 10f. Subsequently, a CMP process is carried out to polish the SiO$_2$ layer so as to have an upper surface positioned at the same level as the upper surfaces of the insulating material layers 10a to 10f. As a result, SiO$_2$ layers 30a and 30b are formed on the barrier conductor layers 28a and 28b and the W layers 29a and 29b within the contact holes 27aa and 27bb.

Subsequently, as illustrated in FIGS. 2JA to 2JD, an RIE process is carried out to etch the upper layers of the SiO$_2$ layers 25, 30a, and 30b. Subsequently, a SiO$_2$ layer 32 is formed on the outer peripheral portions of the Si pillars 11a to 11f. Subsequently, a lithographic process and an ion implantation process are carried out to form N$^+$ layers 33a, 33c, 33d (not shown), and 33f (not shown) in the top portions of the Si pillars 11a, 11c, 11d, and 11f, and to form P$^+$ layers 33b and 33e in the top portions of the Si pillars 11b and 11e. Incidentally, the N$^-$ layers 33a, 33c, 33d, and 33f and the P$^+$ layers 33b and 33e, which serve as sources or drains of SGTs, desirably have a donor or acceptor impurity content as high as possible.

Subsequently, as illustrated in FIGS. 2KA to 2KD, a SiO$_2$ layer 35 is formed over the whole structure. Subsequently, a lithographic process and an RIE process are carried out to form contact holes 36a and 36d on the W layers 22a and 22d, and to form contact holes 36b and 36d on the Si pillars 11c and 11d. Subsequently, on the SiO$_2$ layer 35, a word wiring metal layer WL is formed so as to connect through the contact holes 36a and 36b to the W layers 22a and 22d, and ground wiring metal layers Vss1 and Vss2 are formed so as to connect through the contact holes 36b and 36c to the N$^+$ layers 33c and 33d. Subsequently, a SiO$_2$ layer 37 is formed over the whole structure. Subsequently, a lithographic process and an RIE process are carried out to form contact holes 38a, 38b, 38c, and 38d on the Si pillars 11a, 11b, 11e, and 11f. Subsequently, on the SiO$_2$ layer 37, a bit wiring metal layer BL is formed so as to connect through the contact hole 38a to the N$^-$ layer 33a, a power supply wiring metal layer VDD is formed so as to connect through the contact holes 38b and 38c to the P$^+$ layers 33b and 33e, and an inverted bit wiring metal layer RBL is formed so as to connect through the contact hole 38d to the N$^-$ layer 33f. As a result, an SRAM cell circuit is formed on the P-layer substrate 1a.

This embodiment provides the following advantages.

1. In this embodiment, the N$^+$ layer 12a, the P$^+$ layer 13a, and the W layer 22c, which connects to the gate TiN layer 17b, are connected together through the W layer 29a. The W layer 29a is, within the W layer 22c, embedded in the contact hole 27aa. Similarly, the W layer 29b is, within the W layer 22b, embedded in the contact hole 27bb. As a result, compared with the case of not embedding such a layer, the W layer 22c and the W layer 29a can be connected to each other with certainty. In addition, an increase in the connection area is achieved between the W layer 22c and the W layer 29a, so that, compared with the case of not embedding the layer, a decrease in the connection resistance between the W layer 22c and the W layer 29a is achieved. The same applies to the W layer 22b and the W layer 29b.

2. In this embodiment, the W layers 29a and 29b have upper surfaces positioned lower than the upper surfaces of the gate TiN layers 23a, 23b, 23c, and 23d and the upper surfaces of the W layers 22a, 22b, 22c, and 22d, which connect to the gate TiN layers 23a, 23b, 23c, and 23d. Thus, the W layers 29a and 29b are formed so as to have upper surfaces positioned lower than, with certainty, the upper surfaces of the gate TiN layers 23a, 23b, 23c, and 23d and the W layers 22a, 22b, 22c, and 22d, to thereby prevent, with certainty, electrical short circuit faults between the W layers 29a and 29b, the word wiring metal layer WL, and the ground wiring metal layers VSS1 and VSS2, which are formed on the $SiO_2$ layer 35. In addition, a decrease in the coupling capacitance can be achieved between the W layers 29a and 29b and, for example, the gate TiN layers 23a to 23d and the W layers 22a to 22d. This enables a decrease in the driving voltage to thereby achieve a decrease in the power consumption.

3. In this embodiment, the contact hole 27aa is formed so as to have a bottom portion that is positioned lower than the upper surface of the W layer 22c, that is positioned, in plan view, on the boundary between the $N^+$ layer 12a and the $P^+$ layer 13a, and that is positioned at the upper surfaces of the $N^-$ layer 12a and the $P^+$ layer 13a, or within the $N^+$ layer 12a and the $N^-$ layer 13a. Thus, the contact hole 27aa is formed so as to have a bottom portion positioned within the $P^+$ layer 12a and the $P^-$ layer 13a. This enables an increase in the contact area between the W layer 29a and the $N^+$ layer 12a and $P^+$ layer 13a. This enables a decrease in the connection resistance between the W layer 29a and the $N^+$ layer 12a and $P^+$ layer 13a. This effect of decreasing the connection resistance becomes stronger with a decrease in the area of the contact hole 27aa in plan view. Thus, the effect is advantageous for increasing the degree of integration of SGT circuits.

Second Embodiment

Hereinafter, a method for producing an SRAM cell that is an SGT-including pillar-shaped semiconductor memory device, according to a second embodiment of the present invention, will be described with reference to FIG. 3AA to FIG. 3ED.

As illustrated in FIGS. 3AA to 3AD, the same steps as in the first embodiment are carried out before the formation of the cavities 27a and 27b in FIGS. 2GA to 2GD. Subsequently, a lithographic process and an RIE process for the SiN layer 26 and the $SiO_2$ layer 25 are carried out, to form, in plan view, contact holes 40a and 40b on a region including the boundary between the $N^+$ layer 12a and the $P^+$ layer 13a and on a region including the boundary between the $N^+$ layer 12d and the $P^+$ layer 13b.

Figure 3B:
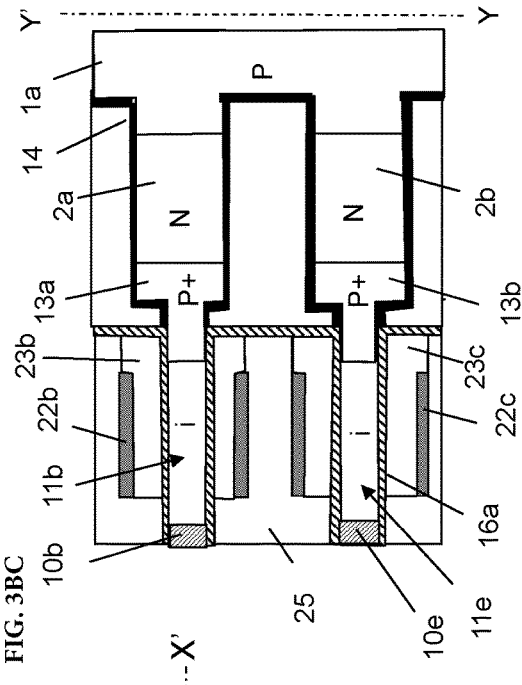
FIG. 3BA is a plan view and FIGS. 3BB to 3BD are sectional structural views that illustrate a method for producing the SGT-including pillar-shaped semiconductor memory device according to the second embodiment.
Figure 3B:
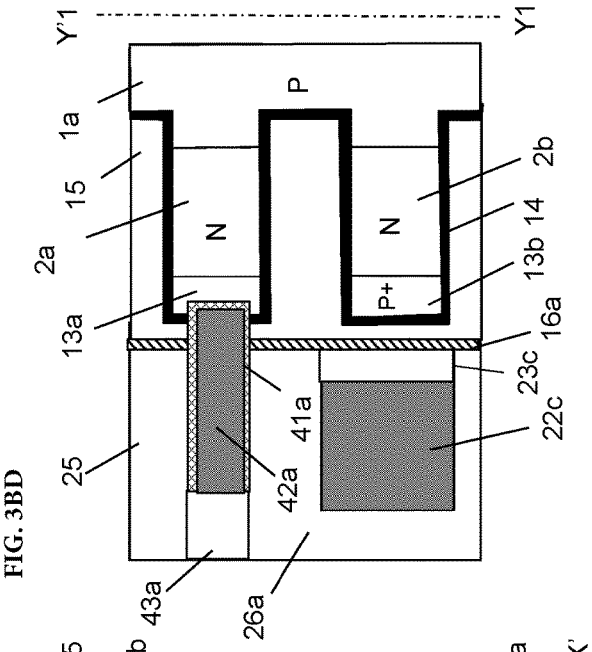
Figure 3B:
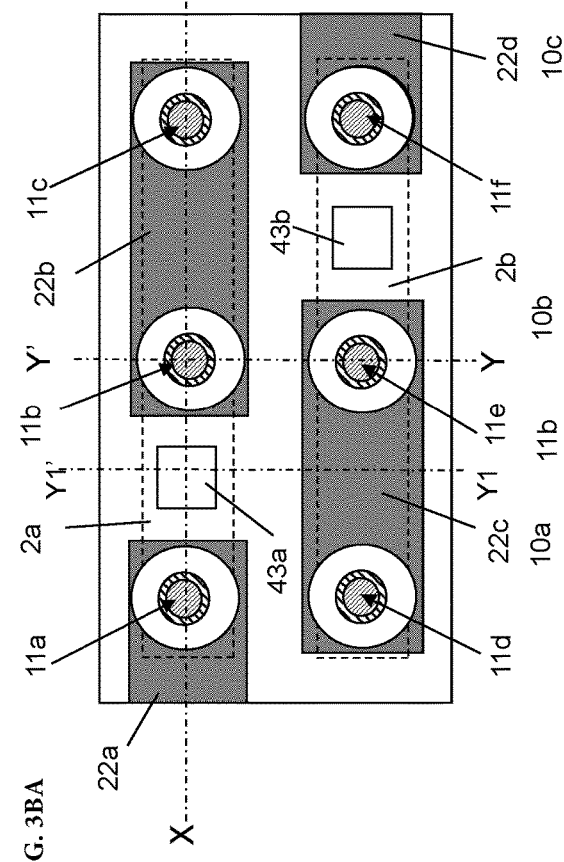
Figure 3B:
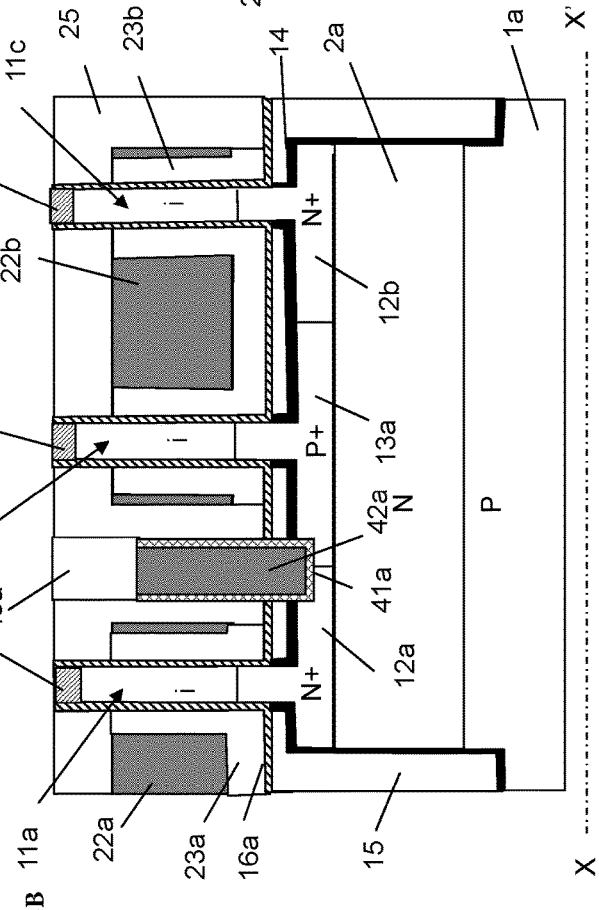

Subsequently, as illustrated in FIGS. 3BA to 3BD, within the contact holes 40a and 40b, barrier conductor layers 41a and 41b (not shown) and W layers 42a and 42b (not shown) are formed so as to have upper surfaces positioned lower than the upper surfaces of the W layers 22a to 22d. Subsequently, $SiO_2$ layers 43a and 43b are formed on the W layers 42a and 42b and the barrier conductor layers 41a and 41b, and within the contact holes 40a and 40b.

Figure 3C:
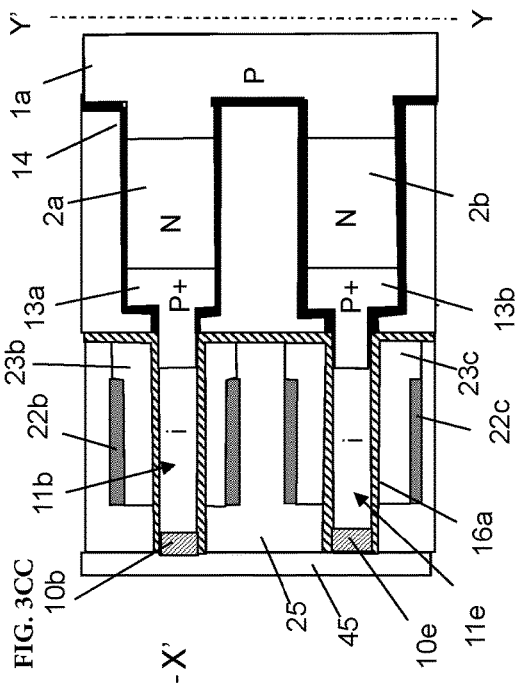
FIG. 3CA is a plan view and FIGS. 3CB to 3CD are sectional structural views that illustrate a method for producing the SGT-including pillar-shaped semiconductor memory device according to the second embodiment.
Figure 3C:
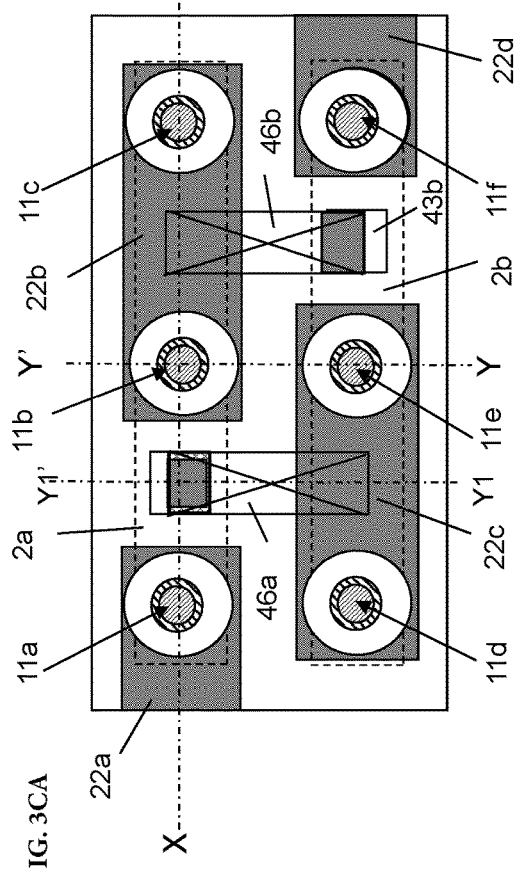
Figure 3C:
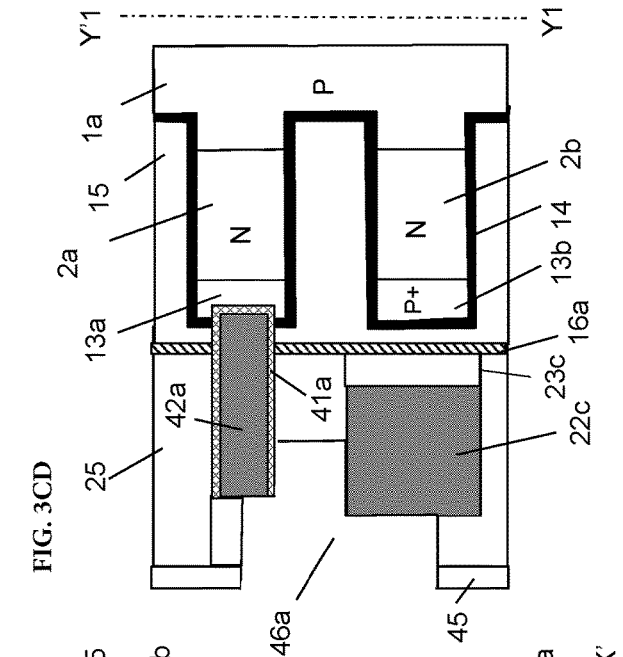
Figure 3C:
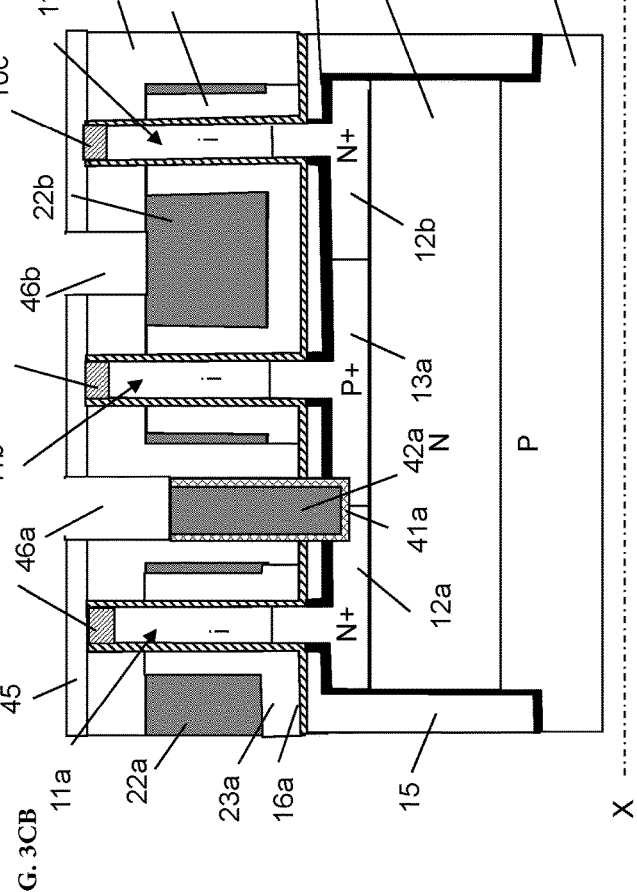

Subsequently, as illustrated in FIGS. 3CA to 3CD, a SiN layer 45 is formed over the whole structure. Subsequently, a contact hole 46a, which connects to, in plan view, the contact hole 40a and the W layer 22c, and a contact hole 46b, which connects to the contact hole 40b and the W layer 22b are formed by a lithographic process and an RIE process for the SiN layer 45 and the $SiO_2$ layer 25. In this case, the bottom portion of the contact hole 46a includes the upper surfaces of the W layers 42a and 22c; and the bottom portion of the contact hole 46b includes the upper surfaces of the W layers 42b and 22b.

Subsequently, as illustrated in FIGS. 3DA to 3DD, the W layers 42a, 42b, 22c, and 22b and the barrier conductor layers 41a and 41b are etched. As a result, contact holes 46aa and 46bb are formed so as to have recesses extending from the upper surfaces to the inside of the W layers 22c and 22b.

Subsequently, as illustrated in FIGS. 3EA to 3ED, within the contact holes 46aa and 46bb and on the SiN layer 45, a barrier conductor layer (not shown) and a W layer (not shown) are formed. A CMP process is carried out to polish the barrier conductor layer and the W layer to reach the upper surface of the $SiO_2$ layer 25. Subsequently, the barrier conductor layer and the W layer are etched by an RIE process. Subsequently, on the barrier conductor layers 41a and 41b and the W layers 42a and 42b, barrier conductor layers 48a and 48b and W layers 49a and 49b are formed so as to have upper surfaces positioned lower than the upper surfaces of the gate W layers 22a to 22d. Subsequently, within the contact holes 46aa and 46bb on the barrier conductor layers 48a and 48b and the W layers 49a and 49b, $SiO_2$ layers 50a and 50b are formed. Subsequently, the steps as in FIG. 2IA to FIG. 2KD are carried out, to thereby form an SRAM circuit on the P-layer substrate 1a.

This embodiment provides the following advantages.

In the first embodiment, the connections between the $N^+$ layer 12a and the $P^+$ layer 13a and the W layer 22c, and the connections between the $N^+$ layer 12d and the $P^+$ layer 13b and the W layer 22b are established through the contact holes 27aa and 27bb, which are formed by a lithographic process and an RIE process carried out one time (refer to FIGS. 2HA to 2HD). By contrast, in this embodiment, the first contact holes 40a and 40b are formed on the upper surfaces of the $N^+$ layers 12a and 12d and the $P^+$ layers 13a and 13b; and the second contact holes 46aa and 46bb are formed after the first contact holes 40a and 40b are filled with W so as to form upper surfaces positioned at the level of the upper surfaces of the W layers 22a to 22d. Thus, the second contact holes 46aa and 46bb can be formed at the same depth on the W layers 42a and 42b and the W layers 22b and 22c. In this way, the W layers 49a and 49b can be formed with certainty.

Third Embodiment

Hereinafter, a method for producing an SRAM cell that is an SGT-including pillar-shaped semiconductor memory device, according to a third embodiment of the present invention, will be described with reference to FIG. 4AA to FIG. 4BD.

As illustrated in FIGS. 4AA to 4AD, steps as in the second embodiment are carried out until the step in FIGS. 3DA to 3DD is carried out. W layers 51a and 51b are formed on the barrier conductor layers 41a and 41b and the W layers 42a and 42b, and in the bottom portions of the contact holes 46aa and 46bb by a selective epitaxial process for W. In the selective growth process for W (refer to H. Itoh, R. Nakata, and T. Moriya: "Creep-up Phenomena in Tungsten Selective CVD and Their Application to VLSI Technologies", IEEE, IEDM85, pp. 606-609 (1985)), W atoms do not adhere to the surfaces of the $SiO_2$ layer 25 and the insulating material layers 10a to 10f, which are insulating material layers, but do on the W layers 42a and 22c in the bottom portion of the contact hole 46aa, on the barrier conductor layer 41a, on the W layers 42b and 22b in the bottom portion of the contact hole 46bb, and on the barrier conductor layer 41b. Subsequently, growth of W is further carried out to grow W in the horizontal direction, to form the W layer 51a, which connects to the W layer 42a and the W layer 22c, and the W layer 51b, which connects to the W layer 22b and the W layer 42b.

Figure 4B:
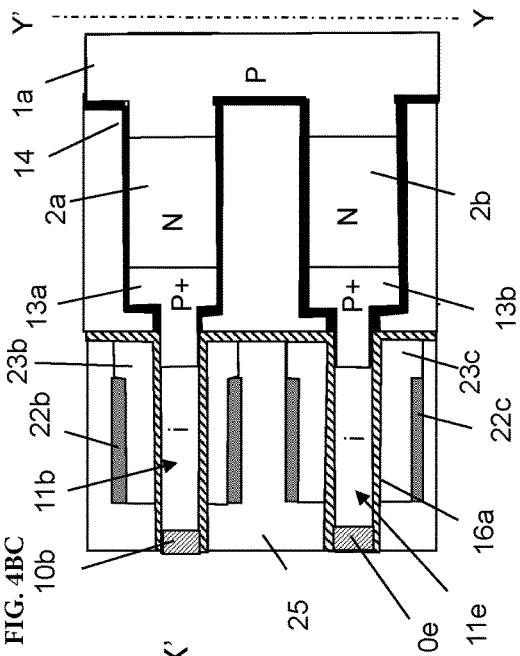
FIG. 4BA is a plan view and FIGS. 4BB to 4BD are sectional structural views that illustrate a method for producing the SGT-including pillar-shaped semiconductor memory device according to the second embodiment.
Figure 4B:
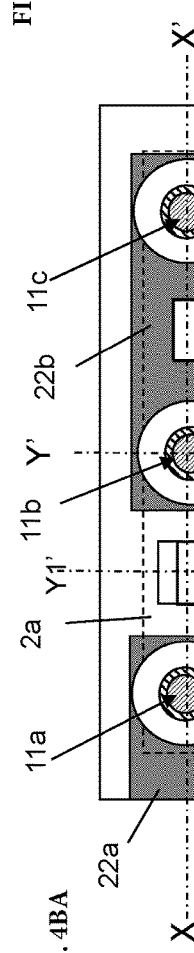
Figure 4B:
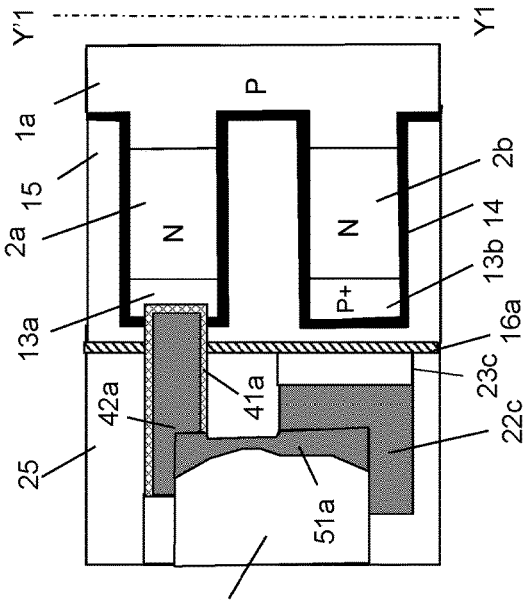
Figure 4B:
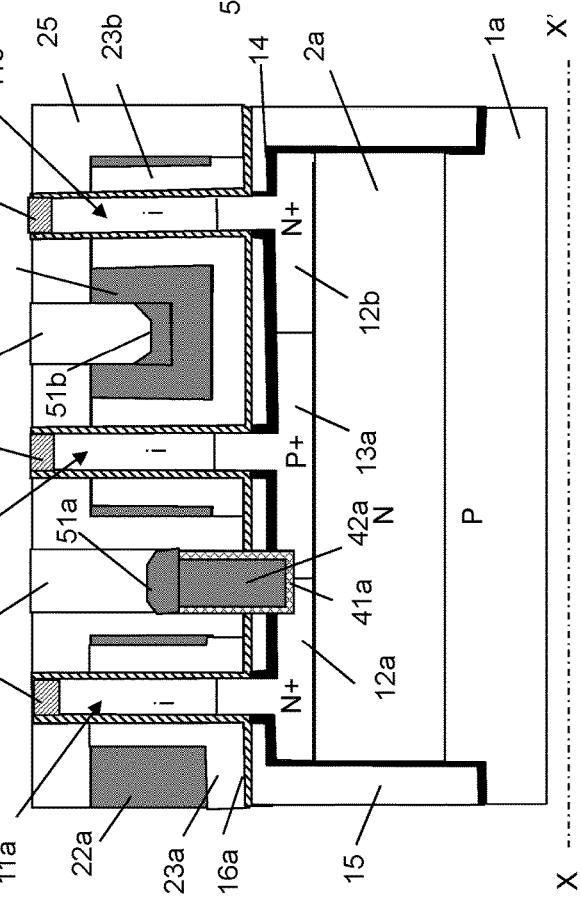

As illustrated in FIGS. 4BA to 4BD, in the same manner as in FIGS. 3EA to 3ED in the second embodiment, $SiO_2$ layers 52a and 52b are formed within the contact holes 46aa and 46bb and on the W layers 51a and 51b so as to have upper surfaces positioned at the same level as the upper surfaces of the $SiO_2$ layer 25 and the insulating material layers 10a to 10f. Subsequently, the steps illustrated in FIGS. 2JA to 2KD in the first embodiment are carried out, to form an SRAM circuit on the P-layer substrate 1a.

This embodiment provides the following advantages.

In the second embodiment, as has been described with reference to FIG. 3DA to FIG. 3ED, a barrier conductor layer (not shown) and a W layer (not shown) are formed within the contact holes 46aa and 46bb and on the SiN layer 45, and a CMP process is carried out to polish the barrier conductor layer and the W layer to reach the upper surface of the $SiO_2$ layer 25. Subsequently, the barrier conductor layer and the W layer are etched by an RIE process. Subsequently, the barrier conductor layers 48a and 48b and the W layers 49a and 49b are formed in the bottom portions of the contact holes 46aa and 46bb on the barrier conductor layers 48a and 48b and the W layers 49a and 49b. By contrast, in this embodiment, instead of the CMP process and the RIE process, the selective growth process for W is directly carried out, to directly form the W layers 51a and 51b on the barrier conductive layers 41a and 41b and the W layers 42a and 42b. This enables simplification of the production steps.

Fourth Embodiment

Hereinafter, a method for producing an SRAM cell that is an SGT-including pillar-shaped semiconductor memory device, according to a fourth embodiment of the present invention, will be described with reference to FIG. 5AA to FIG. 5BD.

As illustrated in FIGS. 5AA to 5AD, the steps until formation of the contact holes 40a and 40b in FIGS. 3AA to 3AD are carried out. Subsequently, a $SiO_2$ layer (not shown) is deposited over the whole structure by a CVD (Chemical Vapor Deposition) process or an ALD process. Subsequently, an RIE process is carried out to etch the $SiO_2$ layer, to form $SiO_2$ layers 53a and 53b on the side surfaces of the contact holes 40a and 40b.

Subsequently, as illustrated in FIGS. 5BA to 5BD, in the same manner as in FIGS. 3BA to 3BD, barrier material layers 54a and 54b and W layers 55a and 55b are formed within the contact holes 40a and 40b. Subsequently, steps as in the second embodiment are carried out to form an SRAM circuit on the P-layer substrate 1a.

This embodiment provides the following advantages.

In this embodiment, the $SiO_2$ layers 53a and 53b, which are insulating material layers, are present between the W layers 55a and 55b and the W layers 22a to 22d. This prevents electrical short circuit faults between the W layers 55a and 55b and the W layers 22a to 22d, the faults being caused by mask misalignment in the lithographic process during formation of the contact holes 40a and 40b.

Fifth Embodiment

Hereinafter, a method for producing an SRAM cell that is an SGT-including pillar-shaped semiconductor memory device, according to a fifth embodiment of the present invention, will be described with reference to FIG. 6AA to FIG. 6BD.

As illustrated in FIGS. 6AA to 6AC, the steps in the first embodiment are carried out until the step in FIGS. 2FA to 2FC is carried out; subsequently, a SiN layer 56 is formed over the whole structure by an ALD process.

Figure 6B:
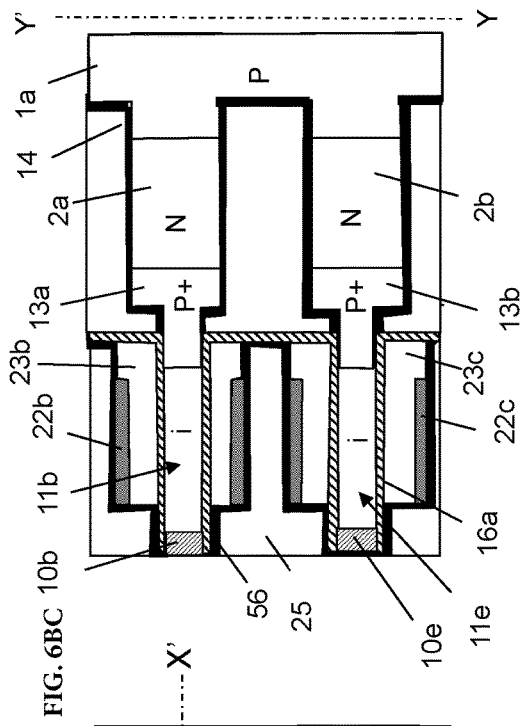
FIG. 6BA is a plan view and FIGS. 6BB to 6BD are sectional structural views that illustrate a method for producing the SGT-including pillar-shaped semiconductor memory device according to the second embodiment.
Figure 6B:
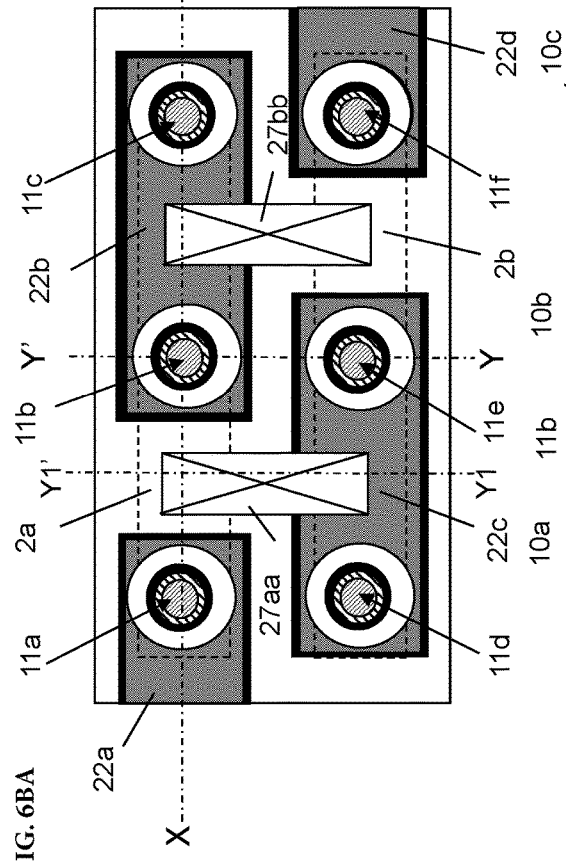
Figure 6B:
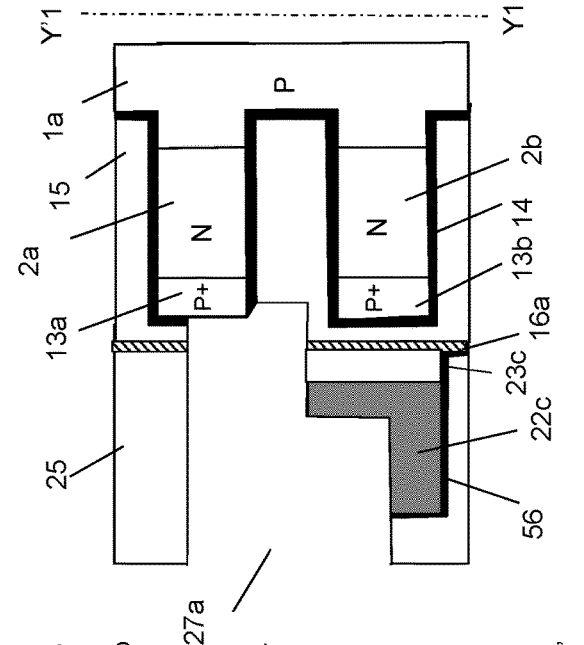
Figure 6B:
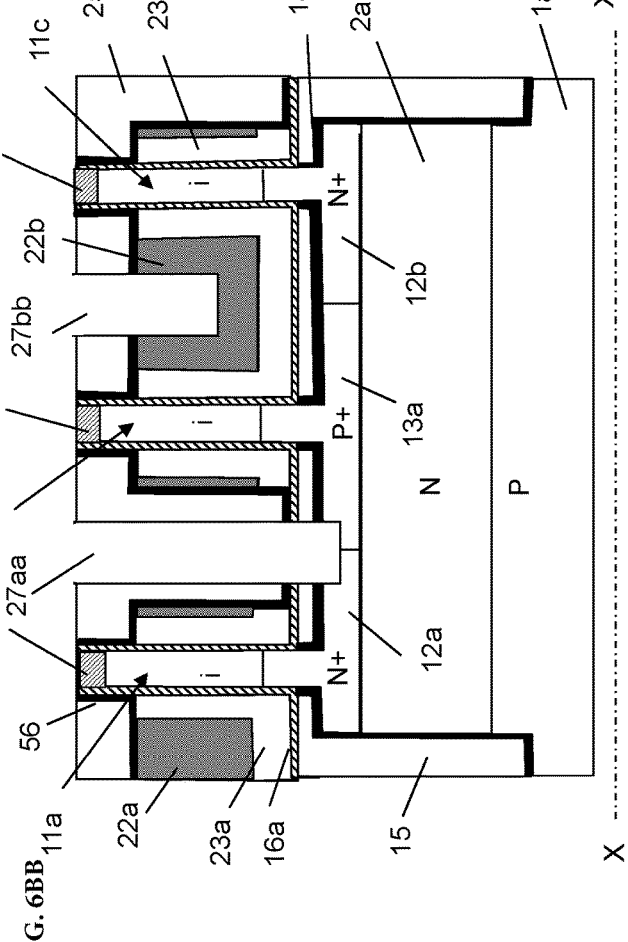

As illustrated in FIGS. 6BA to 6BD, a lithographic process and an RIE process are carried out to form contact holes 27aa and 27bb on the $N^+$ layers 12a and 12d, the $P^+$ layers 13a and 13b, and the W layers 22c and 22b. Subsequently, the steps illustrated in FIG. 2IA to FIG. 2KD are carried out, to form an SRAM circuit on the P-layer substrate 1a.

This embodiment provides the following advantages.

In this embodiment, the SiN layer 56 and the $SiO_2$ layer 25 are present between the contact holes 27aa and 27bb and the W layers 22a to 22d. The formation of the contact holes 27aa and 27bb is achieved by etching the $SiO_2$ layer 25 by an RIE process. In this case, the SiN layer 56 functions as an etching stopper against etching of the $SiO_2$ layer 25. This prevents electrical short circuit faults between the W layers 22a to 22d and the W layers 29a and 29b, the faults being caused by mask misalignment in the lithographic process during formation of the contact holes 27aa and 27bb.

Sixth Embodiment

Figure 7B:
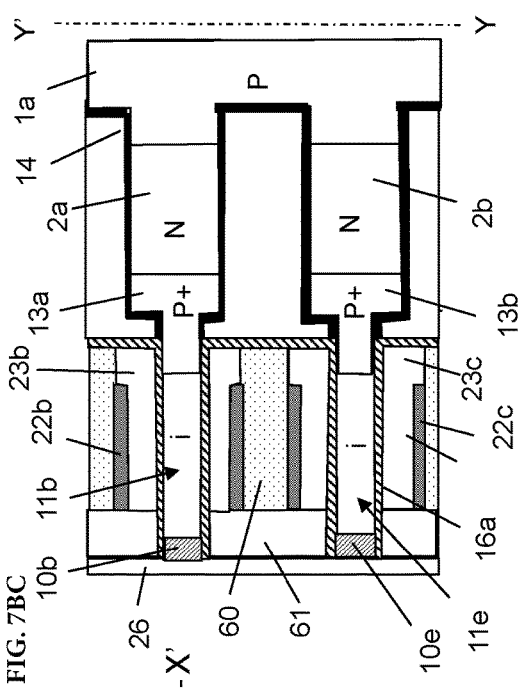
FIG. 7BA is a plan view and FIGS. 7BB to 7BD are sectional structural views that illustrate a method for producing the SGT-including pillar-shaped semiconductor memory device according to the second embodiment.
Figure 7B:
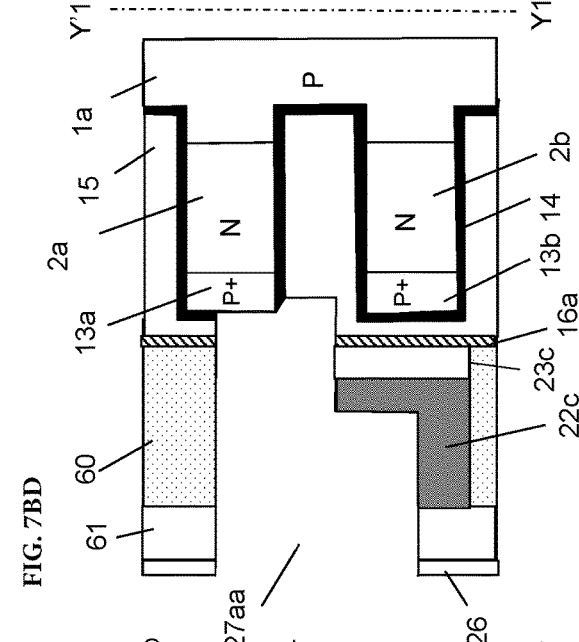
Figure 7B:
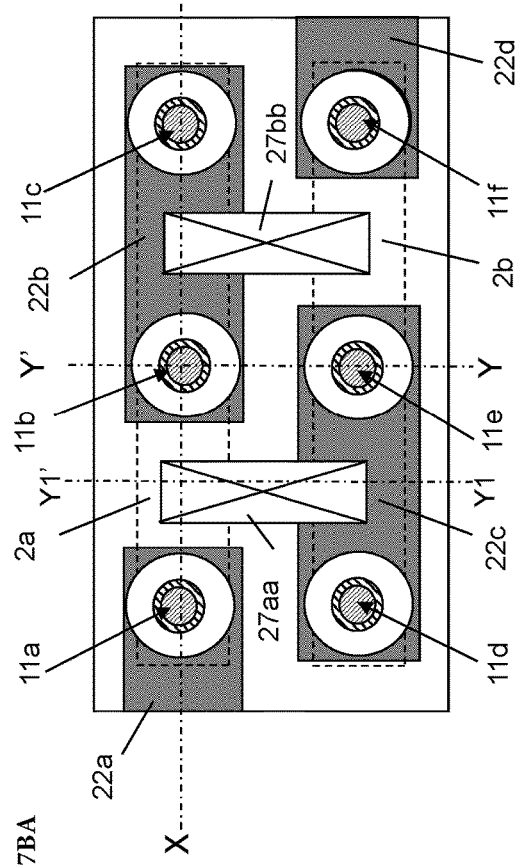
Figure 7B:
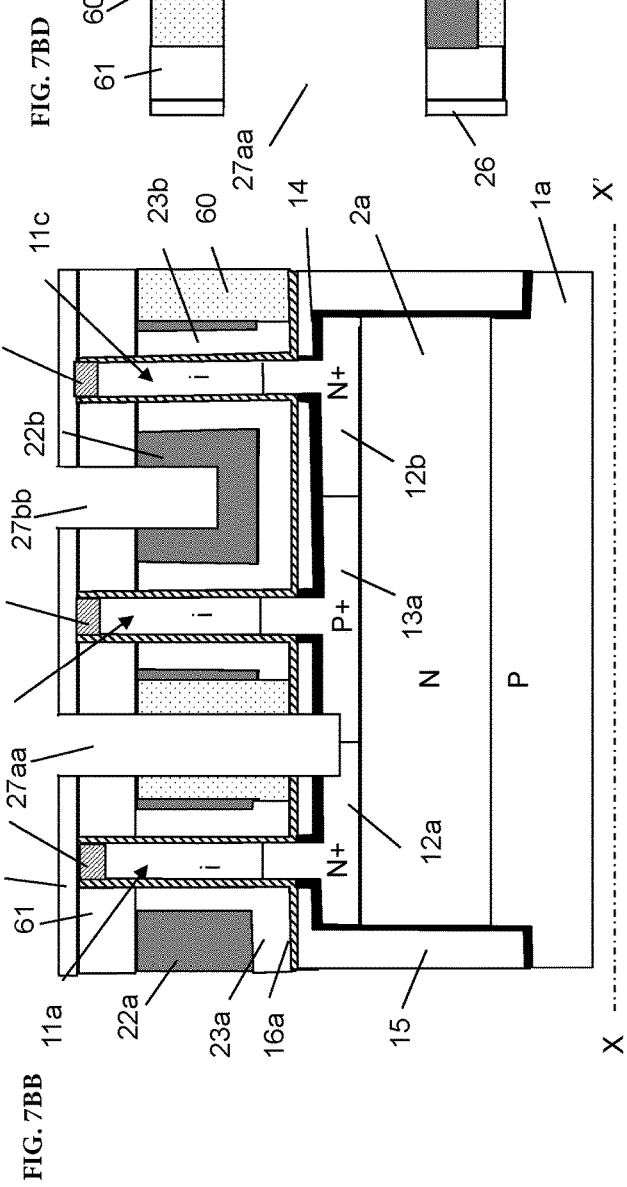

Hereinafter, a method for producing an SRAM cell that is an SGT-including pillar-shaped semiconductor memory device, according to a sixth embodiment of the present invention, will be described with reference to FIG. 7AA to FIG. 7BD.

As illustrated in FIGS. 7AA to 7AD, steps as in the first embodiment are carried out until the step in FIGS. 2FA to 2FC is carried out. Subsequently, a layer 60 of a low dielectric constant material such as a carbon-containing $SiO_2$ (SiOC: Carbon-incorporated Silicon Oxide) is formed so as to have an upper surface positioned at the same level as the upper surfaces of the W layers 22a to 22d. This SiOC layer 60 is formed in the following manner: a SiOC layer (not shown) is deposited over the whole structure so as to have an upper surface positioned higher than the upper surfaces of the insulating material layers 10a to 10f; subsequently, a CMP process is carried out to planarize the upper surface; and, subsequently, etching by an RIE process is carried out to provide the upper surface so as to be positioned at the same level as the upper surfaces of the W layers 22a to 22d.

Subsequently, a $SiO_2$ layer 61 is formed so as to surround the outer periphery of the Si pillars. Subsequently, as in FIGS. 2HA to 2HD in the first embodiment, a SiN layer 26 is formed over the whole structure. Subsequently, as illustrated in FIGS. 7BA to 7BD, a contact hole 27aa is formed so as to have a bottom portion positioned lower than the upper surface of the W layer 22c and positioned on the $N^+$ layer 12a and the $P^+$ layer 13a; and a contact hole 27bb is formed so as to have a bottom portion positioned lower than the upper surface of the W layer 22b and positioned on the $N^+$ layer 12d and the $P^+$ layer 13b. Subsequently, the steps illustrated in FIG. 2IA to FIG. 2KD are carried out, to form an SRAM circuit on the P-layer substrate 1a.

This embodiment provides the following advantages.

In this embodiment, the $SiO_2$ layer 25 (relative dielectric constant: 3.9 to 4.3) in the first embodiment is replaced by the SiOC layer 60 (relative dielectric constant: 2.7 to 2.9), which has a low relative dielectric constant. As a result, the resultant SRAM circuit enables, compared with the first embodiment, a decrease in the coupling capacitance between the W layers 22a to 22d, which are gate conductor layers disposed on both sides of the low dielectric constant SiOC layer 60, and the W layers 29a and 29b, which are connection wiring conductor layers. This enables a decrease in the driving voltage to thereby achieve a decrease in the power consumption.

Seventh Embodiment

Figure 8B:
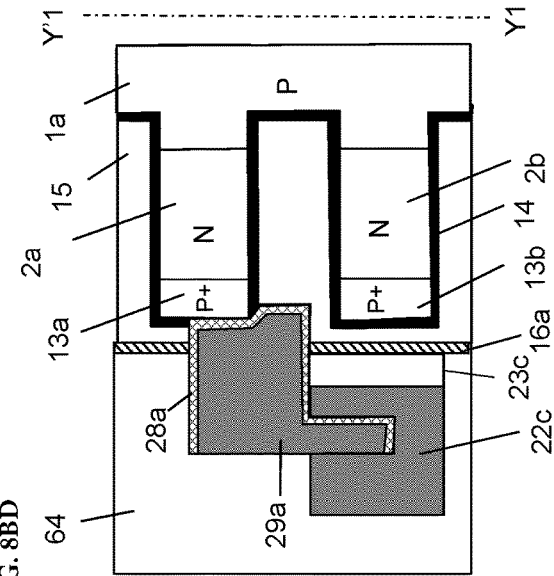
FIG. 8BA is a plan view and FIGS. 8BB to 8BD are sectional structural views that illustrate a method for producing the SGT-including pillar-shaped semiconductor memory device according to the second embodiment.
Figure 8B:
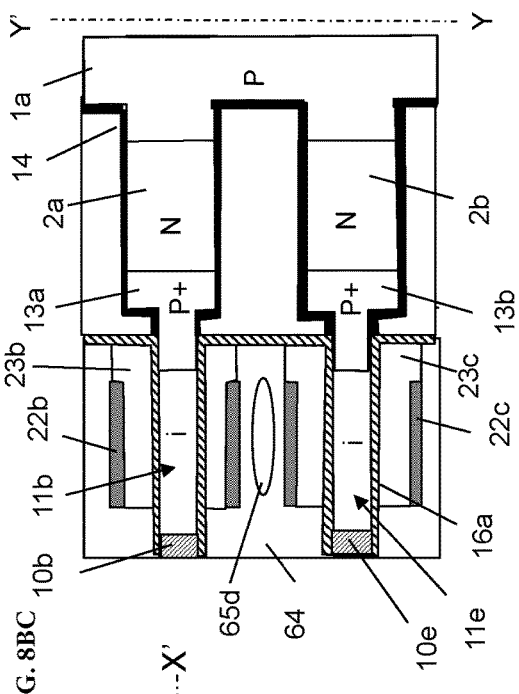
Figure 8B:
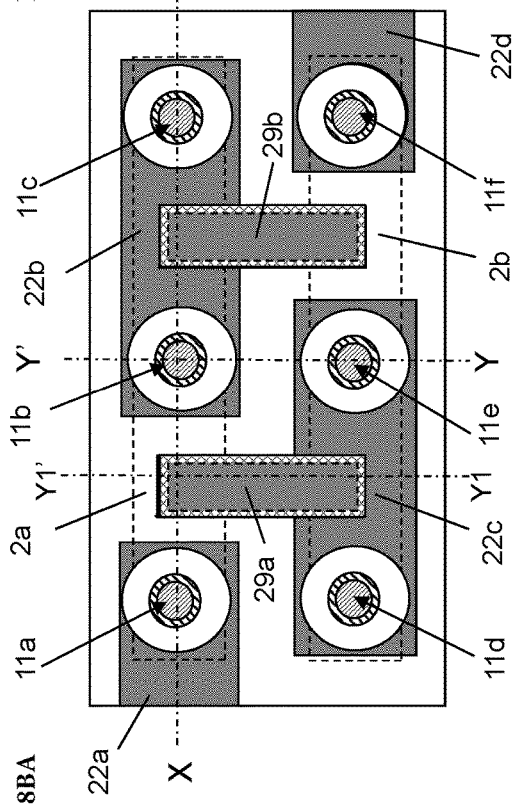
Figure 8B:
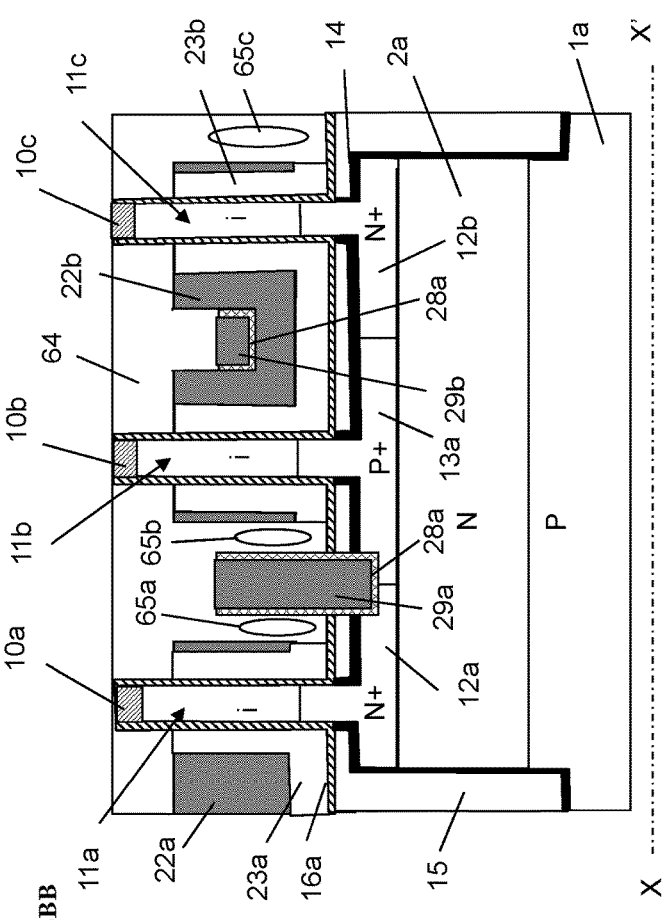

Hereinafter, a method for producing an SRAM cell that is an SGT-including pillar-shaped semiconductor memory device, according to a seventh embodiment of the present invention, will be described with reference to FIG. 8AA to FIG. 8BD.

The steps described with FIG. 2AA to FIG. 2ID in the first embodiment are carried out. Subsequently, as illustrated in FIGS. 8AA to 8AD, the SiO$_2$ layers 25, 30a, and 30b are removed. As a result, a space 63 is formed so as to include narrow regions between the W layers 22a to 22d and the W layer 29a.

Subsequently, a CVD process is carried out to form a SiO$_2$ layer 64. In this formation of the SiO$_2$ layer 64, pores 65a, 65b, 65c, and 65d are formed in the narrow regions between the W layers 22a to 22d and the W layers 29a and 29b.

The same steps as in FIG. 2JA to FIG. 2KD in the first embodiment are carried out, to form an SRAM circuit on the P-layer substrate 1a.

This embodiment provides the following advantages.

In this embodiment, the pores 65a, 65b, and 65c, which have a relative dielectric constant of 1, are present between the W layers 22a to 22d, which are gate conductor layers, and the W layers 29a and 29b, which are connection wiring conductor layers. This enables a decrease in the coupling capacitance between the W layers 22a to 22d, which are gate conductor layers, and the W layers 29a and 29b, which are connection wiring conductor layers, compared with the first embodiment in which the SiO$_2$ layer 25, which has a relative dielectric constant of 3.9 to 4.3, is present over the whole structure. This enables a decrease in the driving voltage to thereby achieve a decrease in the power consumption.

Eighth Embodiment

Hereinafter, a method for producing an SGT-including CMOS inverter chain circuit, according to an eighth embodiment of the present invention, will be described with reference to FIG. 9AA to FIG. 9ED.

Figure 9A:
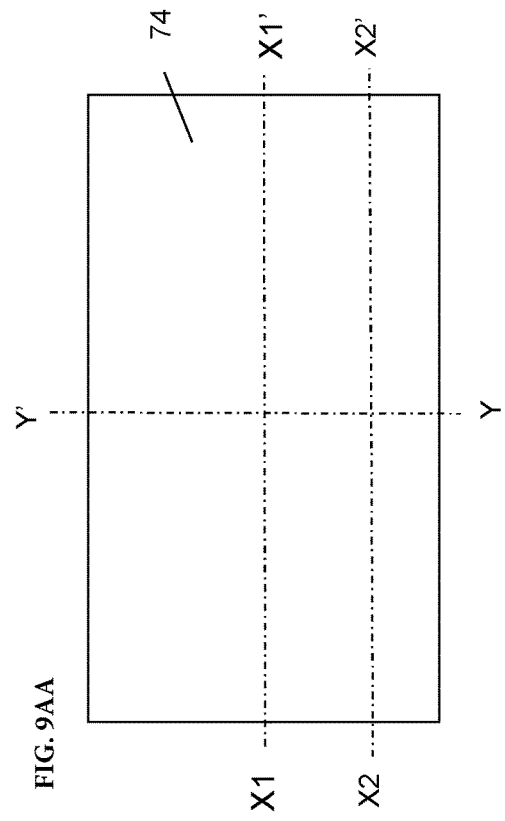
FIG. 9AA is a plan view and FIGS. 9AB to 9AD are sectional structural views that illustrate a method for producing an SGT-including inverter chain circuit device according to the first embodiment.
Figure 9A:
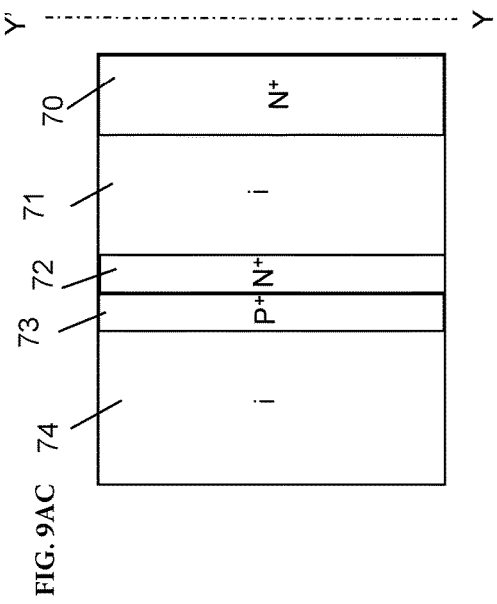
Figure 9A:
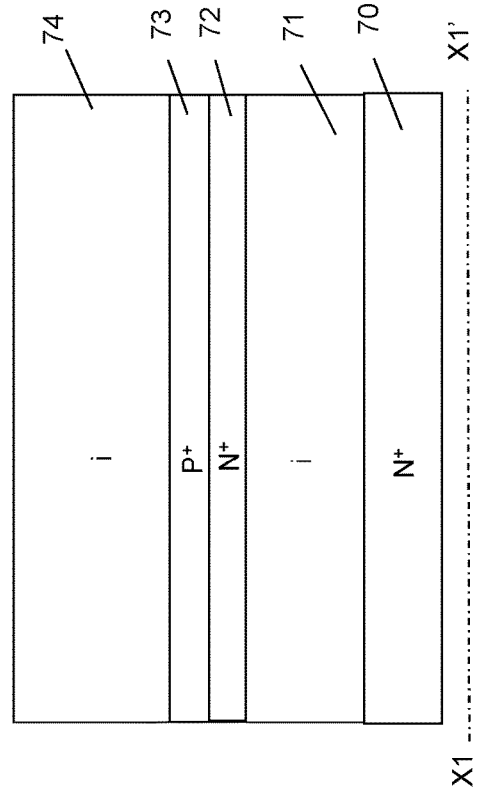
Figure 9A:
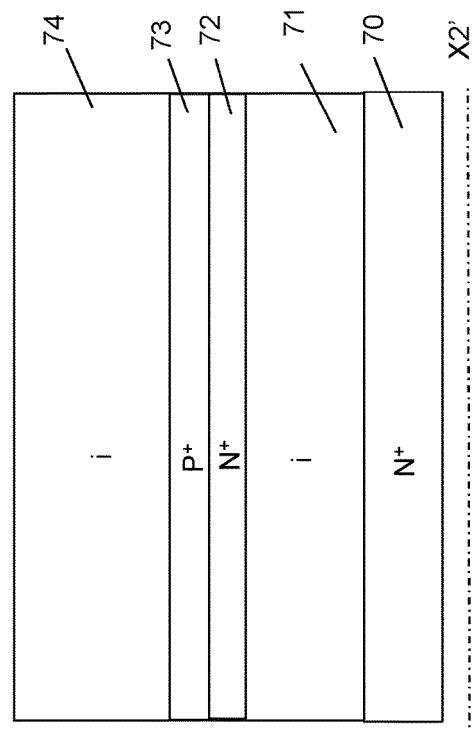

As illustrated in FIGS. 9AA to 9AD, on an N$^-$-layer substrate 70, Si epitaxial growth processes are carried out to form an i layer 71, an N$^+$ layer 72, a P$^+$ layer 73, and an i layer 74 in this ascending order.

Subsequently, as illustrated in FIGS. 9BA to 9BD, mask material layers 75a, 75b, and 75c including, for example, a SiO$_2$ layer and a SiN layer are formed. Subsequently, the mask material layers are used as etching masks, and Si pillars 76a, 76b, and 76c are formed. As a result, within the Si pillars 76a, 76b, and 76c, N$^+$ layers 72a, 72b, and 72c and P$^+$ layers 73a, 73b, and 73c are formed. Subsequently, a gate insulating material layer such as a HfO$_2$ layer (not shown) is formed so as to surround the Si pillars 76a, 76b, and 76c. Subsequently, gate conductor layers such as a TiN layer (not shown) and a W layer (not shown) are formed so as to surround the HfO$_2$ layer. Subsequently, a SiN layer 90a is formed on the outer peripheral portions of the W layers so as to have an upper surface positioned at the lower ends of the N$^+$ layers 72a, 72b, and 72c. Subsequently, holes are formed so as to have, in the perpendicular direction, lower ends positioned at the lower ends of the N$^+$ layers 72a, 72b, and 72c, have upper ends positioned at the upper ends of the P$^+$ layers 73a, 73b, and 73c, and extend through in the horizontal direction the W layer, the TiN layer, and the HfO$_2$ layers 79a, 79b, and 79c to reach the side surfaces of the N$^+$ layers 72a, 72b, and 72c and the P$^+$ layers 73a, 73b, and 73c. This results in separation of the HfO$_2$ layers, the TiN layer, and the W layer into upper and lower layers to form HfO$_2$ layers 78, 79a, 79b, and 79c, TiN layers 80a, 80b, 80c, 81a, 81b, and 81c, and W layers 82a, 82b, 82c, 83a, 83b, and 83c. In plan view, the TiN layers 80a, 81a, 80c, and 81c and the W layers 82a, 82c, 83a, and 83c, which are formed along line Y-Y' and surround the Si pillars 76a and 76c, are arranged so as to be displaced from, in the upward-downward direction, the TiN layers 80b and 81b and the W layers 82b and 83b, which surround the Si pillar 76b. Subsequently, SiO$_2$ layers 85a, 85b, 85c, 86a, 86b, and 86c are formed on the upper and lower side surfaces of the holes. Subsequently, for example, a NiSi layer 88a, which connects to the side surfaces of the N$^+$ layer 72a and the P$^+$ layer 73a, is formed; a NiSi layer 88b, which connects to the side surfaces of the N$^+$ layer 72b and the P$^+$ layer 73b, is formed; and, a NiSi layer 88c, which connects to the side surfaces of the N$^+$ layer 72c and the P$^+$ layer 73c, is formed. In the Si pillars 76a, 76b, and 76c, in plan view, the NiSi layers 88a, 88b, and 88c, the TiN layers 80a, 80b, 80c, 81a, 81b, and 81c and the W layers 82a, 82b, 82c, 83a, 83b, and 83c are arranged so as to be displaced upward or downward in the Y-Y' direction. Subsequently, a SiO$_2$ layer 90b is formed so as to have an upper surface positioned at the level of the upper surfaces of the W layers 83a, 83b, and 83c. Subsequently, a SiO$_2$ layer 90c is formed so as to have an upper surface positioned at the same level as the upper surfaces of the mask material layers 75a, 75b, and 75c.

Figure 9C:
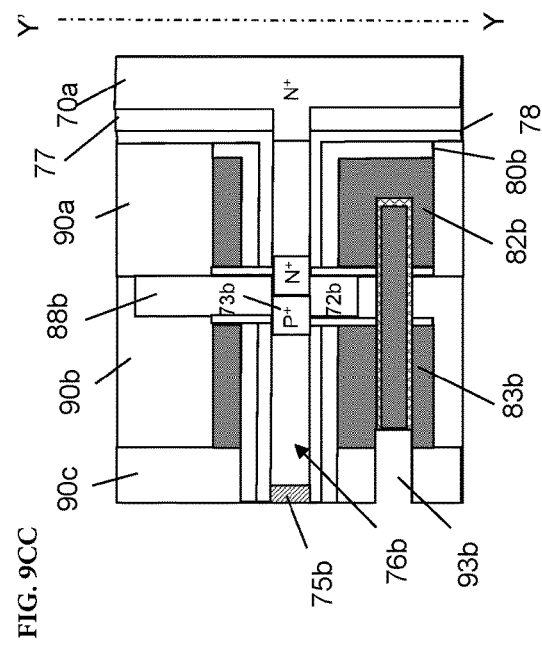
FIG. 9CA is a plan view and FIGS. 9CB to 9CD are sectional structural views that illustrate a method for producing the SGT-including inverter chain circuit device according to the first embodiment.
Figure 9C:
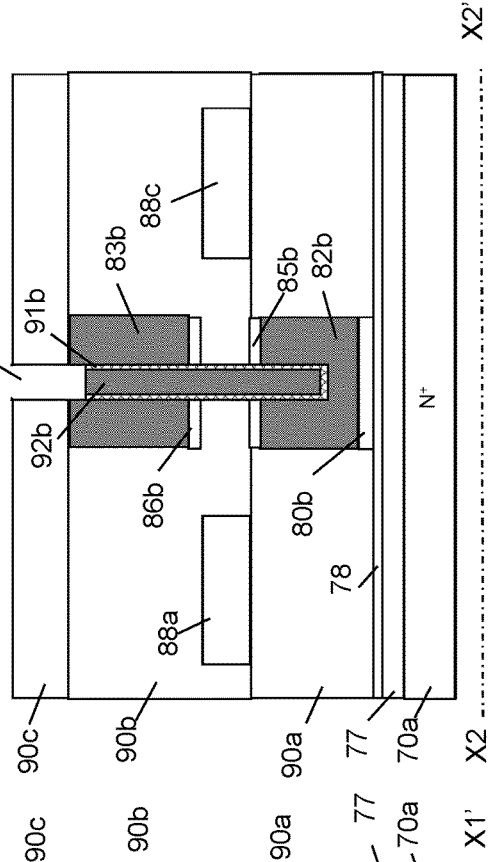
Figure 9C:
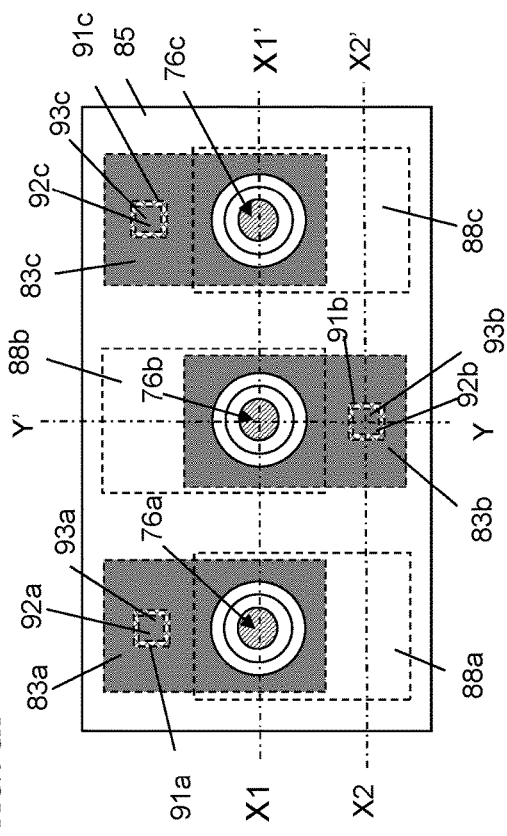
Figure 9C:
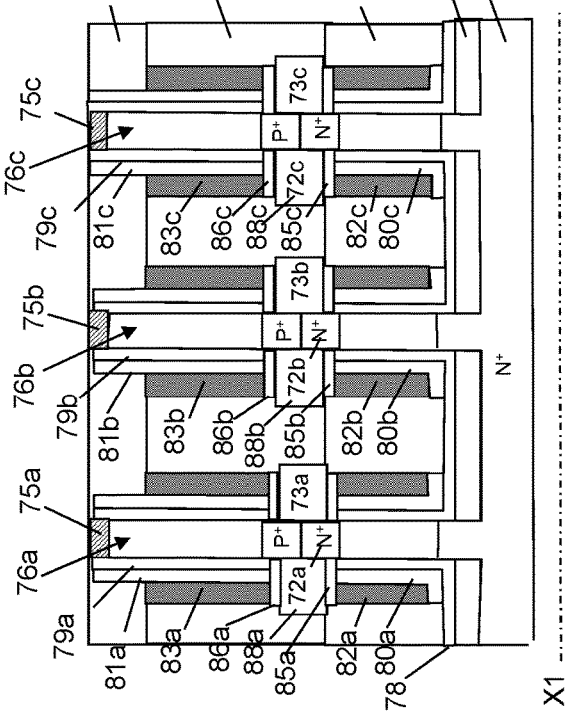

Subsequently, as illustrated in FIGS. 9CA to 9CD, a contact hole 93a is formed so as to extend through the SiO$_2$ layer 90c, the W layer 83a, the SiO$_2$ layer 86a, the SiO$_2$ layer 90b, and the SiO$_2$ layer 85a, and have a bottom portion within the W layer 82a; a contact hole 93b is formed so as to extend through the SiO$_2$ layer 90c, the W layer 83b, the SiO$_2$ layer 86b, the SiO$_2$ layer 90b, and the SiO$_2$ layer 85b, and have a bottom portion within the W layer 82b; and a contact hole 93a is formed so as to extend through the SiO$_2$ layer 90c, the W layer 83c, the SiO$_2$ layer 86c, the SiO$_2$ layer 90b, and the SiO$_2$ layer 85c, and have a bottom portion within the W layer 82c. Subsequently, within the contact holes 93a, 93b, and 93c, barrier conductor layers 91a, 91b, and 91c and W layers 92a, 92b, and 92c are formed so as to have upper surfaces positioned lower than the upper surfaces of the W layers 83a, 83b, and 83c.

Subsequently, as illustrated in FIGS. 9DA to 9DD, contact holes 97a, 97b, and 97c are formed so as to extend through the SiO$_2$ layer 90c and the SiO$_2$ layer 90b; the contact hole 97a has a bottom portion located on the NiSi layer 88a and extending to the inside of the W layer 83b; the contact hole 97b has a bottom portion located on the NiSi layer 88b and extending to the inside of the W layer 83c; and the contact hole 97c has a bottom portion located on the NiSi layer 88c and extending to the inside of the W layer (not shown). Subsequently, within the contact holes 97a, 97b, and 97c, barrier conductor layers 95a, 95b, and 95c and W layers 96a, 96b, and 96c are formed so as to have upper surfaces positioned lower than the upper surfaces of the W layers 83a, 83b, and 83c.

Figure 9E:
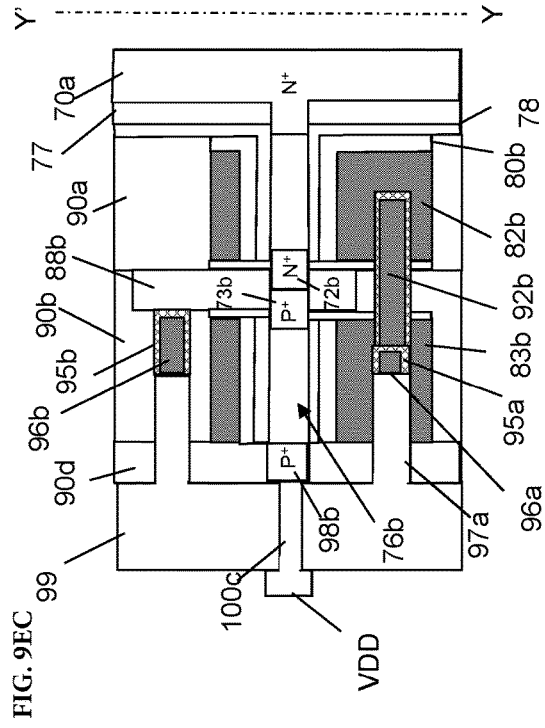
FIG. 9EA is a plan view and FIGS. 9EB to 9ED are sectional structural views that illustrate a method for producing the SGT-including inverter chain circuit device according to the second embodiment of the present invention.
Figure 9E:
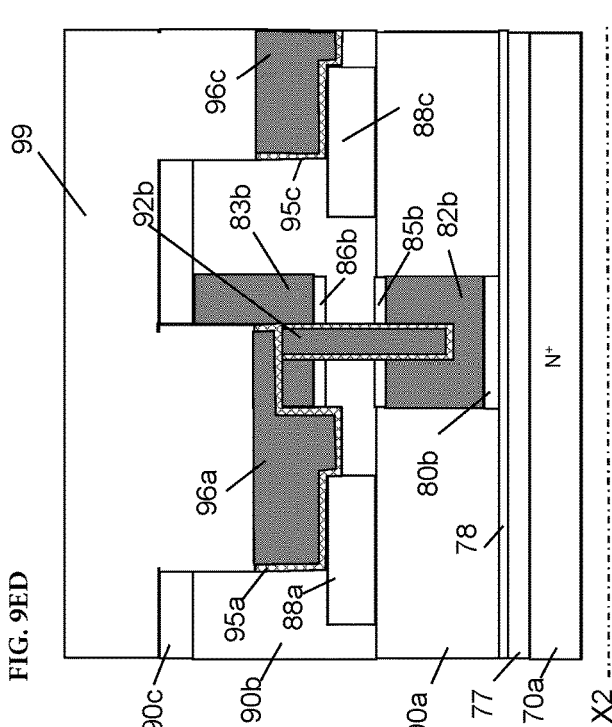
Figure 9E:
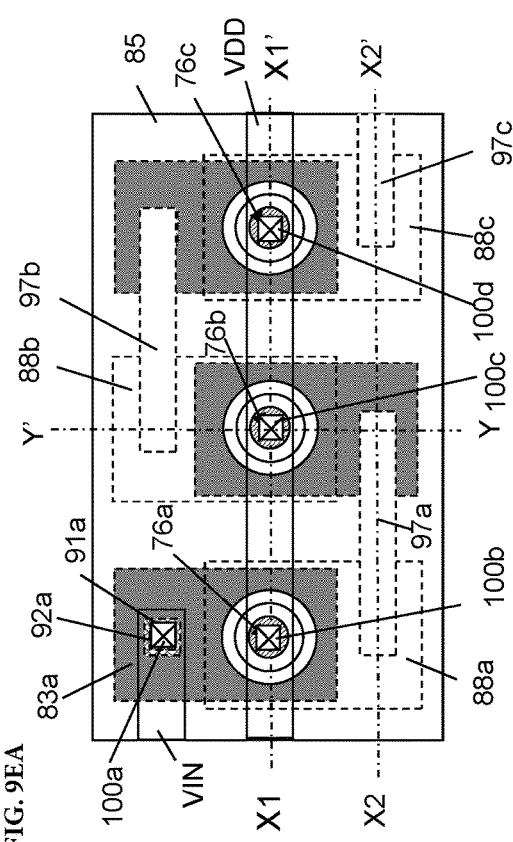
Figure 9E:
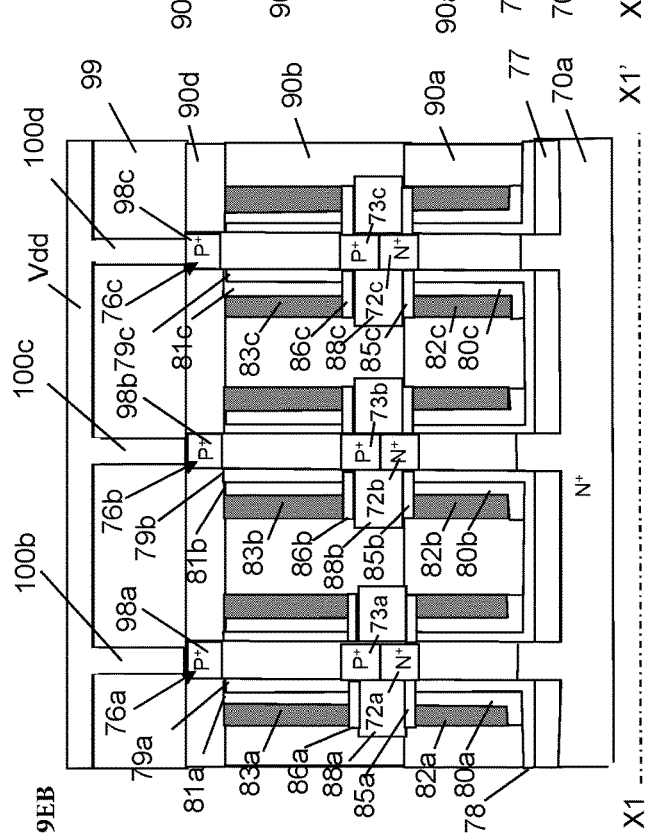
Figure 10:
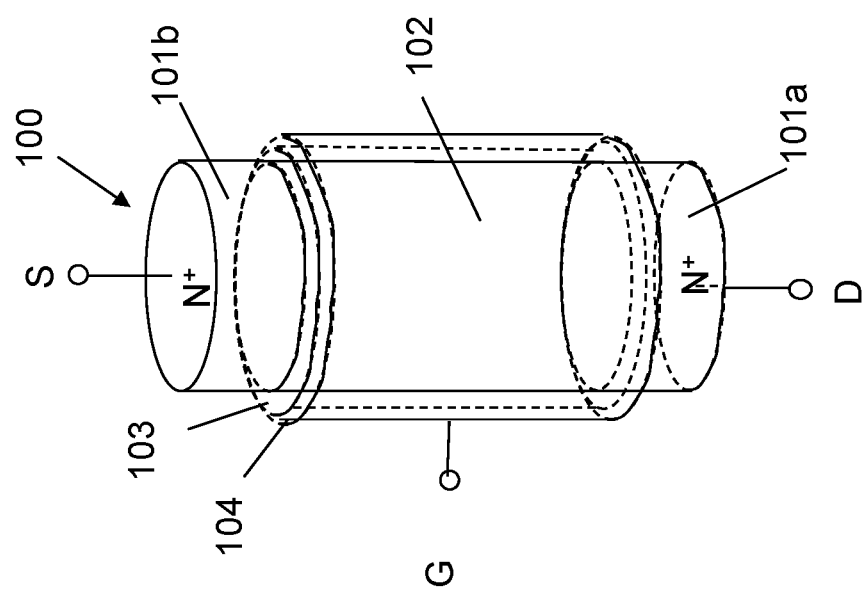
FIG. 10 is a schematic structural view that illustrates an existing SGT.

Subsequently, as illustrated in FIGS. 9EA to 9ED, an RIE process is carried out to remove upper portions of the TiN layers 81a, 81b, and 81c and the HfO₂ layers 79a, 79b, and 79c, and the SiO₂ layer 90c, and the mask material layers 75a, 75b, and 75c. Subsequently, an ion implantation process, for example, is carried out to form a P⁺ layer 98a in the top portion of the Si pillar 76a, a P⁺ layer 98b in the top portion of the Si pillar 76b, and a P⁺ layer 98c in the top portion of the Si pillar 76c. Subsequently, the contact holes 97a, 97b, and 97c are filled to form a SiO₂ layer 99, which covers the whole structure and has a flat upper surface. Subsequently, on the W layer 92a, a contact hole 100a is formed; and, on the P⁺ layers 98a, 98b, and 98c, contact holes 100b, 100c, and 100d are formed. Subsequently, an input wiring metal layer VIN is formed so as to connect through the contact hole 100a to the W layers 82a and 83a; and a power supply wiring metal layer Vdd is formed so as to connect through the contact holes 100b, 100c, and 100d to the P⁺ layers 98a, 98b, and 98c. Subsequently, the N⁺-layer substrate 70a at the bottom portion is externally connected to a ground wiring metal layer (not shown). As a result, a CMOS inverter chain circuit is formed on the N⁺-layer substrate 70a.

This embodiment provides the following advantages.

In this embodiment, in the structure in which two SGTs are formed in upper and lower portions of each of the Si pillars 76a, 76b, and 76c, the NiSi layer 88a, and the W layer 82b and the W layer 83b, which are gate conductor layers, which are three layers separated in the perpendicular direction, are connected together through the W layers 96a and 92b, which are connection conductor layers. Referring to the second embodiment, the N⁺ layer 12a and the P⁺ layer 13a correspond to the NiSi layer 88a; the W layer 22c serving as a gate corresponds to the W layer 83b serving as a gate; the W layer 42a serving as a connection conductor layer corresponds to the W layer 92a serving as a connection conductor layer; and the W layer 49a serving as a connection conductor layer corresponds to the W layer 96a serving as a connection conductor layer. Note that, in the first embodiment, the W layer 42a serving as a connection conductor layer has a bottom portion present not beyond but within the W layer 22c serving as a gate; by contrast, in this embodiment, the W layer 92a serving as a connection conductor layer, the W layer 82b serving as a gate, and the W layer 83b serving as a gate are formed so as to continuously extend in the perpendicular direction. This enables formation of high-density connections between layers overlapping in plan view. As a result, an increase in the density of an SGT-including circuit can be achieved.

Incidentally, the first embodiment is described as to the case of forming an SRAM circuit on the P-layer substrate 1a. Alternatively, another substrate such as an SOI (Silicon On Insulator) may be used. The same applies to other embodiments.

The first embodiment is described as to the case of forming an SRAM cell circuit; however, application to other SGT-including circuits is also possible. In the first embodiment, the N⁻ layer 12a, which is in the bottom portion of a Si pillar 11a, is connected through the W layer 29a to the gate W layer 22c of another Si pillar 11d. In addition, the N⁻ layer 12a, which is in the bottom portion of a Si pillar 11a, is connected through the W layer 29a to the gate W layer 22c of another Si pillar 11e. Similarly, the P⁻ layer 13a, which is in the bottom portion of a Si pillar 11b, is connected through the W layer 29a to the gate W layer 22c of other Si pillars 11d and 11e. In this way, the present invention is applied to a connection between an impurity layer in the bottom portion of a Si pillar having an SGT and a gate conductor layer of another Si pillar having an SGT. Accordingly, the present invention is also applicable to circuits in which the source or drain of a MOS field-effect transistor is connected to the gate of another MOS field-effect transistor, such as various flip-flop circuits, latch circuits, and DRAM (Random Access Memory) sense circuits. This enables an increase in the degree of integration of such circuits. The same applies to other embodiments.

The first embodiment is described as to the case of forming a single SGT in each of the Si pillars 11a to 11f. However, the present invention is also applicable to cases where two or more SGTs are formed in each of the Si pillars 11a to 11f. The same applies to other embodiments.

In the first embodiment, the gate TiN layers 23a to 23d and the W layers 22a to 22d connected thereto are formed. Alternatively, the gate TiN layers 23a to 23d and the W layers 22a to 22d may be layers of other materials. Alternatively, the gate TiN layers 23a to 23d and the W layers 22a to 22d may be layers of the same material. As with the barrier metal layers, the gate TiN layers 23a to 23d and the W layers 22a to 22d may each be a conductor layer constituted by a plurality of layers. The same applies to other embodiments.

In the first embodiment, the N⁻ layers 12a to 12d and the P⁻ layers 13a and 13b, which are in the bottom portions of the Si pillars 11a to 11f, are formed so as to be connected to the bottom portions of the Si pillars 11a to 11f and to extend in the horizontal direction. In the N⁺ layers 12a to 12d and the P⁺ layers 13a and 13b, the regions extending in the horizontal direction function as impurity region connection layers for forming the connection W layers 29a and 29b on these regions. The impurity region connection layers extending in the horizontal direction may be layers formed of other semiconductor or conductor materials. The same applies to other embodiments.

In the first embodiment, the W layers 22a to 22d connect to the TiN layers 23a to 23d, which serve as gate conductor layers, and extend in the horizontal direction. The W layers 22a to 22d function as gate connection conductor layers for forming the connection W layers 29a and 29b on the W layers 22a to 22d. These gate connection conductor layers extending in the horizontal direction may be conductor material layers of the same material as that of the gate conductor layers or conductor material layers of a material different from that of the gate conductor layers. The same applies to other embodiments.

In the first embodiment, the contact holes 27aa and 27bb are formed on the N⁻ layers 12a and 22d and the P⁺ layers 13a and 13b. By contrast, the contact holes 27aa and 27bb may be formed on a silicide layer or a metal layer formed on the N⁻ layers 12a and 22d and the P⁺ layers 13a and 13b. An N⁺ layer or a P⁺ layer may be formed in lower portions of the Si pillars 11a to 11f; and, on a low-resistance semiconductor layer or conductor layer connecting to the side surface of the N⁻ layer or P⁻ layer, the contact holes 27aa and 27bb may be formed. Incidentally, this low-resistance semiconductor layer connecting to the side surface of the N⁺ layer or P⁺ layer may be constituted by a single continuous semiconductor layer, or may be constituted by different semiconductor layers. The same applies to other embodiments.

In the first embodiment, the HfO₂ layer 16a is used as a gate insulating film. Alternatively, a layer of another material may be used. The gate insulating material layer may be constituted by a plurality of material layers. The same applies to other embodiments.

In the first embodiment, the Si pillars 11a to 11f, the N⁺ layers 12a to 12d, 33a, 33c, 33d, and 33f, and the P⁻ layers 13a, 13b, 33b, and 33e, which are formed of Si, are used. Alternatively, other semiconductor materials may be used. The same applies to other embodiments.

In the first embodiment, the source and drain of each SGT are of the same conductivity. Alternatively, a tunnel SGT in which the source and the drain are of different conductivities may be used. The same applies to other embodiments.

In the first embodiment, lithographic processes are used to pattern the material layers. In such a lithographic process, in addition to a resist layer, a single material layer or a plurality of material layers formed under the resist layer may be patterned to form a mask material layer for a material layer to be etched. The same applies to other embodiments.

In the second embodiment, the contact hole 43a on the N⁺ layer 12a and the P⁺ layer 13a, and the contact hole 43b on the N⁻ layer 12d and the P⁺ layer 13b are first formed. Subsequently, in plan view, the contact hole 46a, which extends from the contact hole 43a to the W layer 22c, and the contact hole 46b, which extends from the contact hole 43b to the W layer 22b, are formed. The order of forming the contact holes 43a and 43b and the contact holes 46a and 46b may be changed.

In the second embodiment, the barrier conductor layers 48a and 48b are formed on the W layers 42a and 22b. For the connection between the W layers 42a and 22b and the W layers 49a and 49b, the barrier conductor layers 48a and 48b may be omitted. These barrier conductor layers may be omitted when the W layers 42a and 22b and the W layers 49a and 49b are replaced by other conductor material layers and barrier conductor layers are not necessary for operating the circuit. The same applies to other embodiments in which at least two conductor layers are connected together such as connections between the W layers 42a and 22b and the W layers 49a and 49b.

In the third embodiment and the fourth embodiment, a selective growth process is employed to form the W layers 51a, 51b, 55a, and 55b. Instead of the W layers 51a, 51b, 55a, and 55b, other conductor materials may be formed by a selective growth process.

In the fourth embodiment, the SiO₂ layers 53a and 53b are formed on the side surfaces of the contact holes 40a and 40b. Alternatively, instead of the SiO₂ layers 53a and 53b, other insulating material layers may be used.

The fifth embodiment, which is described with the steps in the first embodiment, is similarly applicable to other embodiments.

In the fifth embodiment, instead of the SiN layer 56, a layer of another insulating material may be used as long as the material provides an etching stopper against etching for forming the contact holes 27aa and 27bb.

In the sixth embodiment, the SiOC layer 60, which is formed of a low dielectric constant material, may be replaced by a layer of another material such as porous silica or SiOF.

In the seventh embodiment, the SiO₂ layer 64 may be replaced by another insulating layer.

In the seventh embodiment, the pores 65a and 65b are formed in the SiO₂ layer 64, which is between the W layers 22a and 22b, which are disposed on both sides of the W layer 29a. The regions where the pores 65a to 65d are formed may be changed depending on the design of the SRAM cell or other circuits.

The eighth embodiment, which is described as to the case of forming a CMOS inverter chain circuit, is also applicable to other SGT-including circuits.

In the eighth embodiment, the W layer 92b serving as a connection conductor layer is used to establish the connection between the gate W layer 82b and the gate W layer 83b. Alternatively, depending on the circuit formed, a connection between, within the same Si pillar 76b, the W layer 83b and one or both of the impurity region P⁺ layer 73b and N⁺ layer 72b, or a connection to the impurity region N⁺ layer 70a may be employed.

In the eighth embodiment, the W layer 96a connects the NiSi layer 88a, which connects to the P⁺ layer 73a and the N⁻ layer 72a, to the W layer 83b, which connects to the gate TiN layer 81b. By contrast, depending on the circuit formed, the W layer 96a may connect to a connection conductor layer connecting to the P⁺ layer 73a or the N⁺ layer 72a. In the Si pillar 76a, the W layer 96a may connect to one or both of the W layer 82a and the N⁺ layer 70a, which are positioned lower than the P⁺ layer 73a and the N⁺ layer 72a. The same applies to, in addition to the Si pillar 76a, the Si pillar 76c. Depending on the circuit formed, the same applies to connections between the Si pillar 76b and a plurality of other Si pillars.

The eighth embodiment is described as to the case where the present invention is applied to a circuit in which two SGTs are formed per Si pillar. Alternatively, the present invention is also applicable to the cases where one or three or more SGTs are formed per Si pillar. A circuit in which a single SGT is formed per Si pillar includes a gate conductor layer, and a conductor layer that connects to the gate conductor layer through a contact hole extending through a source or drain impurity region that is present under the gate conductor layer. When three or more SGTs are formed per Si pillar, a contact through-hole is formed that corresponds to the contact hole 93b and connects together three or more conductor layers or impurity regions.

In the eighth embodiment, holes are formed so as to have, in the perpendicular direction, lower ends positioned at the lower ends of the N⁻ layers 72a, 72b, and 72c, have upper ends positioned at the upper ends of the P⁺ layers 73a, 73b, and 73c, and extend through in the horizontal direction the W layer, the TiN layer, the HfO₂ layers 79a, 79b, and 79c to reach the side surfaces of the N⁺ layers 72a, 72b, and 72c and the P⁺ layers 73a, 73b and 73c. As a result, the HfO₂ layer, the TiN layer, and the W layer are divided into upper and lower portions, to form the HfO₂ layers 78, 79a, 79b, and 79c, the TiN layers 80a, 80b, 80c, 81a, 81b, and 81c, and the W layers 82a, 82b, 82c, 83a, 83b, and 83c. By contrast, the HfO₂ layer 78, the TiN layers 80a, 80b, and 80c, and the W layers 82a, 82b, and 82c may be first formed; subsequently, the NiSi layers 88a, 88b, and 88c, over and under which the SiO₂ layers 85a, 85b, 85c, 86a, 86b, and 86c are formed, may be formed; subsequently, the HfO₂ layers 79a, 79b, and 79c, the TiN layers 81a, 81b, and 81c, and the W layers 83a, 83b, and 83c may be formed. Alternatively, another process and other material layers may be employed to form the gate insulating layer and the gate conductor layer of each SGT, a conductor connection layer connecting to the N⁺ layers 72a, 72b, and 72c and the P⁻ layers 73a, 73b, and 73c, and insulating layers over and under the conductor connection layer.

In the first embodiment, as described above, the contact hole 27aa is formed so as to have a bottom portion positioned within the N⁺ layer 12a and the P⁺ layer 13a, to thereby increase the contact area between the W layer 29a and the N⁺ layer 12a and P⁺ layer 13a. This enables a decrease in the connection resistance between the W layer 29a and the N⁺ layer 12a and P⁺ layer 13a. The same applies to other embodiments.

The present invention encompasses various embodiments and modifications without departing from the broad spirit and scope of the present invention. The above-described embodiments are mere examples of the present invention and do not limit the scope of the present invention. The above-described embodiments and modifications can be appropriately combined. The above-described embodiments from which some elements are omitted as necessary still fall within the technical idea of the present invention.

A pillar-shaped semiconductor memory device and a method for producing a pillar-shaped semiconductor memory device according to the present invention provide at low cost a semiconductor device that has a high degree of integration and a high performance.

What is claimed is:

1. A pillar-shaped semiconductor device comprising:
    a first semiconductor pillar on a substrate and extending in a direction perpendicular to the substrate;
    a first impurity region below the first semiconductor pillar;
    a first impurity region connection layer connecting to the first impurity region, extending in a horizontal direction, and comprising a semiconductor or a conductor;
    a second impurity region above the first semiconductor pillar;
    a first gate insulating layer surrounding the first semiconductor pillar between the first impurity region and the second impurity region;
    a first gate conductor layer surrounding the first gate insulating layer;
    a second semiconductor pillar on the substrate and extending in the direction perpendicular to the substrate;
    a third impurity region below the second semiconductor pillar;
    a fourth impurity region above the second semiconductor pillar;
    a second gate insulating layer surrounding the second semiconductor pillar between the third impurity region and the fourth impurity region;
    a second gate conductor layer surrounding the second gate insulating layer;
    a second gate connection conductor layer connecting to the second gate conductor layer, extending in a horizontal direction, and comprising a conductor;
    a first contact hole connecting to the first impurity region connection layer and the second gate connection conductor layer, and having a portion overlapping, in plan view, at least the second gate connection conductor layer, the portion having a bottom portion positioned, in the perpendicular direction, lower than upper surfaces of the second gate conductor layer and the second gate connection conductor layer; and
    a first connection conductor layer within the first contact hole and connecting to the first impurity region connection layer and the second gate connection conductor layer.

2. The pillar-shaped semiconductor device according to claim 1, wherein an upper surface of the first connection conductor layer, in the perpendicular direction, is lower than the upper surfaces of the second gate conductor layer and the second gate connection conductor layer.

3. The pillar-shaped semiconductor device according to claim 1, wherein the second gate conductor layer and the second gate connection conductor layer are layers of an identical material.

4. The pillar-shaped semiconductor device according to claim 1, wherein in plan view, the first contact hole includes:
    a second contact hole on the first impurity region connection layer or on the second gate connection conductor layer, and
    a third contact hole that connects to the second gate connection conductor layer when the second contact hole is on the first impurity region connection layer, or that connects to the first impurity region connection layer when the second contact hole is on the second gate connection conductor layer,
    the third contact hole has a bottom portion positioned lower than the upper surfaces of the second gate conductor layer and the second gate connection conductor layer, and
    the first connection conductor layer includes the second connection conductor layer within the second contact hole and the third connection conductor layer connecting to the second connection conductor layer and being present within the third contact hole.

5. The pillar-shaped semiconductor device according to claim 1, further comprising:
    a first gate connection conductor layer connecting to the first gate conductor layer and extending in a horizontal direction;
    a first interlayer insulating layer surrounding side surfaces of the first gate connection conductor layer and the second gate connection conductor layer; and
    a second interlayer insulating layer surrounding a side surface of the first interlayer insulating layer, being formed of a material different from a material of the first interlayer insulating layer, and being used for formation of the first contact hole.

6. The pillar-shaped semiconductor device according to claim 5, further comprising:
    a third interlayer insulating layer between a side surface of the first gate connection conductor layer, a side surface of the second gate connection conductor layer, and a side surface of the first connection conductor layer, the third interlayer insulating layer having a dielectric constant smaller than a dielectric constant of a silicon oxide film.

7. The pillar-shaped semiconductor device according to claim 5, comprising:
    a fourth interlayer insulating layer having a pore between one or both of a side surface of the first gate connection conductor layer and a side surface of the second gate connection conductor layer, and a side surface of the first connection conductor layer.

8. The pillar-shaped semiconductor device according to claim 4, comprising:
    a fourth contact hole connecting to a bottom of the third contact hole and connecting to a material layer being positioned lower than the third contact hole and being a semiconductor or conductive layer; and
    a fourth connection conductor layer within the fourth contact hole.

9. The pillar-shaped semiconductor device according to claim 1, wherein the first contact hole has a bottom portion within the first impurity region.

10. A method for producing a pillar-shaped semiconductor device including
    a first impurity region, a first semiconductor pillar, and a second impurity region disposed on a substrate in a hierarchical manner and in a direction perpendicular to the substrate;

a third impurity region, a second semiconductor pillar, and a fourth impurity region that are disposed on the substrate; in a hierarchical manner in the direction perpendicular to, the substrate, the first impurity region below the first semiconductor pillar, the third impurity region below the second semiconductor pillar; and a first impurity region connection layer, formed of a semiconductor or a conductor, connecting to the first impurity region, and extending in a horizontal direction, the method comprising:

forming a first gate insulating layer so as to surround the first semiconductor pillar;

forming a second gate insulating layer so as to surround the second semiconductor pillar;

forming a first gate conductor layer so as to surround the first gate insulating layer;

forming a second gate conductor layer so as to surround the second gate insulating layer;

forming a second gate connection conductor layer connecting to the second gate conductor layer and extending in a horizontal direction;

forming a first contact hole connecting to the first impurity region connection layer and the second gate connection conductor layer, and, in plan view, having a portion overlapping at least the second gate connection conductor layer, the portion having a bottom portion positioned, in the perpendicular direction, lower than upper surfaces of the second gate conductor layer and the second gate connection conductor layer; and forming a first connection conductor layer within the first contact hole so as to connect to the first impurity region connection layer and the second gate connection conductor layer.

11. The method for producing a pillar-shaped semiconductor device according to claim 10, wherein forming the first connection conductor layer comprises forming the layer so as to have an upper surface positioned lower than upper surfaces of the second gate conductor layer and the second gate connection conductor layer in the perpendicular direction.

12. The method for producing a pillar-shaped semiconductor device according to claim 10, wherein forming the second gate conductor layer and the second gate connection conductor layer comprises forming the layers of an identical material.

13. The method for producing a pillar-shaped semiconductor device according to claim 10, further comprising:

forming a second contact hole on the first impurity region connection layer;

forming a second connection conductor layer within the second contact hole;

forming a third contact hole on and connecting to the second contact hole and the second gate connection conductor layer; and forming a third connection conductor layer within the third contact hole, the second contact hole and the third contact hole together forming the first contact hole, the second connection conductor layer and the third connection conductor layer together forming the first connection conductor layer.

14. The method for producing a pillar-shaped semiconductor device according to claim 10, further comprising:

forming a fourth contact hole on the second gate connection conductor layer;

forming a fourth connection conductor layer within the fourth contact hole;

forming a fifth contact hole on and connecting to the fourth contact hole and the first impurity region connection layer; and forming a fifth connection conductor layer within the fifth contact hole, the fourth contact hole and the fifth contact hole together forming the first contact hole, and the fourth connection conductor layer and the fifth connection conductor layer together forming the first connection conductor layer.

15. The method for producing a pillar-shaped semiconductor device according to claim 10, further comprising:

forming a first gate connection conductor layer connecting to the first gate conductor layer, and extending in a horizontal direction;

forming a first interlayer insulating layer surrounding side surfaces of the first gate connection conductor layer and the second gate connection conductor layer; and forming a second interlayer insulating layer surrounding a side surface of the first interlayer insulating layer, formed of a material different from a material of the first interlayer insulating layer, and providing a higher etching rate than the first interlayer insulating layer with an etching species for forming the first contact hole.

16. The method for producing a pillar-shaped semiconductor device according to claim 10, further comprising forming a third interlayer insulating layer surrounding a side surface of the first connection conductor layer, and having a smaller relative dielectric constant than a silicon oxide film.

17. The method for producing a pillar-shaped semiconductor device according to claim 10, further comprising forming a fourth interlayer insulating layer surrounding the first connection conductor layer and having a pore therein.

18. The method for producing a pillar-shaped semiconductor device according to claim 13, further comprising:

forming a sixth contact hole connecting to a bottom of the third contact hole, and connecting to a material layer being positioned lower than the third contact hole and being a semiconductor or conductive layer; and forming a sixth connection conductor layer within the third contact hole and the sixth contact hole.

19. The method for producing a pillar-shaped semiconductor device according to claim 14, further comprising:

forming a seventh contact hole connecting to a bottom of the fourth contact hole, and connecting to a material layer being positioned lower than the fourth contact hole and being a semiconductor or conductive layer; and forming a seventh connection conductor layer within the fourth contact hole and the seventh contact hole.

20. The method for producing a pillar-shaped semiconductor device according to claim 10, wherein forming the first contact hole comprises forming the contact hole to have a bottom portion within the first impurity region connection layer.

* * * * *